(12) United States Patent
Deguet et al.

(10) Patent No.: US 8,664,084 B2
(45) Date of Patent: Mar. 4, 2014

(54) METHOD FOR MAKING A THIN-FILM ELEMENT

(75) Inventors: Chrystel Deguet, Saint Ismier (FR); Laurent Clavelier, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 713 days.

(21) Appl. No.: 12/088,047

(22) PCT Filed: Sep. 25, 2006

(86) PCT No.: PCT/FR2006/002184
§ 371 (c)(1),
(2), (4) Date: Jun. 12, 2008

(87) PCT Pub. No.: WO2007/036631
PCT Pub. Date: Apr. 5, 2007

(65) Prior Publication Data
US 2008/0254591 A1     Oct. 16, 2008

(30) Foreign Application Priority Data

Sep. 28, 2005 (FR) ..................... 05 09897

(51) Int. Cl.
*H01L 21/20* (2006.01)
*H01L 21/46* (2006.01)

(52) U.S. Cl.
USPC .... 438/458; 438/459; 438/977; 257/E21.124; 257/E21.125

(58) Field of Classification Search
USPC ......... 438/455, 459, 458, 977; 257/E21, 122, 257/E21.124, E21.125
See application file for complete search history.

(56) References Cited

U.S. PATENT DOCUMENTS

| | | | |
|---|---|---|---|
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |

(Continued)

FOREIGN PATENT DOCUMENTS

| | | |
|---|---|---|
| DE | 101 53 319 A1 | 5/2003 |
| EP | 0 355 913 | 2/1990 |

(Continued)

OTHER PUBLICATIONS

English Translation of International Preliminary Report On Patentability (5 pgs).

(Continued)

*Primary Examiner* — Mary Wilczewski
(74) *Attorney, Agent, or Firm* — Brinks Hofer Gilson & Lione

(57) ABSTRACT

A method for making a thin-film element includes epitaxially growing a first crystalline layer on a second crystalline layer of a support where the second crystalline layer is a material different from the first crystalline layer, the first crystalline layer having a thickness less than a critical thickness. A dielectric layer is formed on a side of the first crystalline layer opposite to the support to form a donor structure. The donor structure is assembled with a receiver layer and the support is removed.

16 Claims, 3 Drawing Sheets

(56) References Cited

U.S. PATENT DOCUMENTS

| | | | |
|---|---|---|---|
| 4,832,253 A | 5/1989 | Kloucek et al. | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A * | 1/1990 | Reisman et al. | 438/459 |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A * | 5/1991 | Godbey et al. | 438/459 |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,131,968 A | 7/1992 | Wells et al. | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,280,819 A | 1/1994 | Newkirk et al. | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A | 4/1995 | Yamagata et al. | |
| 5,413,951 A | 5/1995 | Ohori et al. | |
| 5,442,205 A * | 8/1995 | Brasen et al. | 257/191 |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,741,733 A | 4/1998 | Bertagnolli et al. | |
| 5,753,038 A | 5/1998 | Vichr et al. | |
| 5,804,086 A | 9/1998 | Bruel | |
| 5,811,348 A | 9/1998 | Matushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A | 3/1999 | Davidson | |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,080,640 A | 6/2000 | Gardner et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 | 3/2001 | Joly et al. | |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,256,864 B1 | 7/2001 | Gaud et al. | |
| 6,271,101 B1 | 8/2001 | Fukunaga | |
| 6,276,345 B1 | 8/2001 | Nelson et al. | |
| 6,287,940 B1 | 9/2001 | Cole et al. | |
| 6,294,478 B1 | 9/2001 | Shkaguchi et al. | |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 | 10/2002 | Suga | |
| 6,485,533 B1 | 11/2002 | Ishizaki et al. | |
| 6,504,235 B2 | 1/2003 | Schmitz et al. | |
| 6,513,564 B2 | 2/2003 | Bryan et al. | |
| 6,529,646 B1 | 3/2003 | Wight et al. | |
| 6,534,380 B1 | 3/2003 | Yamauchi et al. | |
| 6,548,375 B1 | 4/2003 | De Los Santos et al. | |
| 6,573,126 B2 * | 6/2003 | Cheng et al. | 438/149 |
| 6,593,212 B1 | 7/2003 | Kub et al. | |
| 6,596,569 B1 | 7/2003 | Bao et al. | |
| 6,607,969 B1 | 8/2003 | Kub et al. | |
| 6,632,082 B1 | 10/2003 | Smith | |
| 6,645,831 B1 | 11/2003 | Shaheen et al. | |
| 6,645,833 B2 | 11/2003 | Brendel | |
| 6,653,207 B2 | 11/2003 | Ohya et al. | |
| 6,727,549 B1 | 4/2004 | Doyle | |
| 6,756,285 B1 | 6/2004 | Moriceau et al. | |
| 6,756,286 B1 | 6/2004 | Moriceau et al. | |
| 6,762,076 B2 | 7/2004 | Kim et al. | |
| 6,764,936 B2 | 7/2004 | Daneman et al. | |
| 6,770,507 B2 | 8/2004 | Abe et al. | |
| 6,774,010 B2 | 8/2004 | Chu et al. | |
| 6,809,009 B2 | 10/2004 | Aspar et al. | |
| 6,828,214 B2 * | 12/2004 | Notsu et al. | 438/455 |
| 6,846,690 B2 | 1/2005 | Farcy et al. | |
| 6,887,769 B2 | 5/2005 | Kellar et al. | |
| 6,893,936 B1 * | 5/2005 | Chen et al. | 438/407 |
| 6,902,987 B1 | 6/2005 | Tong et al. | |
| 6,927,147 B2 * | 8/2005 | Fitzgerald et al. | 438/458 |
| 6,946,365 B2 | 9/2005 | Aspar et al. | |
| 6,947,365 B2 | 9/2005 | Lai et al. | |
| 6,991,956 B2 * | 1/2006 | Ghyselen et al. | 438/46 |
| 7,018,909 B2 * | 3/2006 | Ghyselen et al. | 438/455 |
| 7,029,548 B2 | 4/2006 | Aspar et al. | |

(56) References Cited

U.S. PATENT DOCUMENTS

| | | | |
|---|---|---|---|
| 7,029,980 B2 * | 4/2006 | Liu et al. | 438/311 |
| 7,052,978 B2 | 5/2006 | Shaheen et al. | |
| 7,067,396 B2 | 6/2006 | Aspar et al. | |
| 7,071,014 B2 * | 7/2006 | Currie et al. | 438/26 |
| RE39,484 E | 2/2007 | Bruel | |
| 7,247,545 B2 * | 7/2007 | Maa et al. | 438/455 |
| 7,256,075 B2 * | 8/2007 | Ghyselen et al. | 438/149 |
| 7,341,923 B2 * | 3/2008 | Yonehara | 438/455 |
| 7,348,260 B2 * | 3/2008 | Ghyselen | 438/458 |
| 7,416,957 B2 * | 8/2008 | Ponomarev | 438/455 |
| 7,459,374 B2 * | 12/2008 | Aulnette et al. | 438/455 |
| 7,465,646 B2 * | 12/2008 | Le Vaillant | 438/458 |
| 7,494,897 B2 | 2/2009 | Fournel et al. | |
| 7,498,234 B2 | 3/2009 | Aspar et al. | |
| 7,534,701 B2 * | 5/2009 | Ghyselen et al. | 438/458 |
| 7,615,463 B2 | 11/2009 | Aspar et al. | |
| 7,648,853 B2 * | 1/2010 | Bauer | 438/87 |
| 7,670,930 B2 | 3/2010 | Tauzin et al. | |
| 7,713,369 B2 | 5/2010 | Aspar et al. | |
| 7,772,087 B2 | 8/2010 | Nguyen et al. | |
| 7,883,994 B2 | 2/2011 | Moriceau et al. | |
| 7,902,038 B2 | 3/2011 | Aspar et al. | |
| 8,142,593 B2 * | 3/2012 | Deguet et al. | 156/235 |
| 8,252,663 B2 * | 8/2012 | Fournel | 438/458 |
| 8,309,431 B2 * | 11/2012 | Nguyen et al. | 438/458 |
| 8,368,049 B2 * | 2/2013 | Kawashima et al. | 257/13 |
| 2001/0007367 A1 | 7/2001 | Ohkubo | |
| 2001/0007789 A1 | 7/2001 | Aspar et al. | |
| 2002/0000646 A1 | 1/2002 | Gooch et al. | |
| 2002/0025604 A1 | 2/2002 | Tiwari | |
| 2002/0048948 A1 | 4/2002 | Gang | |
| 2002/0081861 A1 | 6/2002 | Robinson et al. | |
| 2002/0083387 A1 | 6/2002 | Miner et al. | |
| 2002/0145489 A1 | 10/2002 | Cornett et al. | |
| 2002/0153563 A1 | 10/2002 | Ogura | |
| 2002/0185469 A1 | 12/2002 | Podlesnik et al. | |
| 2002/0185684 A1 | 12/2002 | Campbell et al. | |
| 2003/0001221 A1 | 1/2003 | Fischer et al. | |
| 2003/0077885 A1 | 4/2003 | Aspar et al. | |
| 2003/0119279 A1 | 6/2003 | Enquist | |
| 2003/0119280 A1 * | 6/2003 | Lee et al. | 438/459 |
| 2003/0134488 A1 | 7/2003 | Yamazaki et al. | |
| 2003/0134489 A1 | 7/2003 | Schwarzenbach et al. | |
| 2003/0162367 A1 | 8/2003 | Roche | |
| 2003/0199105 A1 | 10/2003 | Kub et al. | |
| 2003/0234075 A1 | 12/2003 | Aspar et al. | |
| 2004/0009649 A1 | 1/2004 | Kub et al. | |
| 2004/0029358 A1 | 2/2004 | Park et al. | |
| 2004/0031979 A1 * | 2/2004 | Lochtefeld et al. | 257/233 |
| 2004/0092051 A1 * | 5/2004 | Currie et al. | 438/22 |
| 2004/0126708 A1 | 7/2004 | Jing et al. | |
| 2004/0144487 A1 | 7/2004 | Martinez et al. | |
| 2004/0150006 A1 | 8/2004 | Aulnette et al. | |
| 2004/0157409 A1 * | 8/2004 | Ghyselen et al. | 438/458 |
| 2004/0171232 A1 | 9/2004 | Cayrefoureq et al. | |
| 2004/0209441 A1 | 10/2004 | Maleville et al. | |
| 2004/0222500 A1 | 11/2004 | Aspar et al. | |
| 2004/0235266 A1 | 11/2004 | Tong | |
| 2004/0262686 A1 | 12/2004 | Shaheen et al. | |
| 2005/0029224 A1 | 2/2005 | Aspar et al. | |
| 2005/0042842 A1 * | 2/2005 | Lei et al. | 438/459 |
| 2005/0067377 A1 | 3/2005 | Lei et al. | |
| 2005/0122845 A1 | 6/2005 | Lizzi | |
| 2005/0148122 A1 | 7/2005 | Yonehara | |
| 2005/0148163 A1 | 7/2005 | Nguyen et al. | |
| 2005/0215071 A1 | 9/2005 | Moriceau et al. | |
| 2005/0250294 A1 * | 11/2005 | Ghyselen | 438/458 |
| 2006/0128117 A1 * | 6/2006 | Ghyselen et al. | 438/455 |
| 2006/0191627 A1 | 8/2006 | Aspar et al. | |
| 2006/0252229 A1 | 11/2006 | Joly et al. | |
| 2006/0281212 A1 | 12/2006 | Moriceau et al. | |
| 2007/0037363 A1 | 2/2007 | Aspar et al. | |
| 2007/0087526 A1 * | 4/2007 | Chhaimi et al. | 438/455 |
| 2007/0128840 A1 * | 6/2007 | Chen et al. | 438/493 |
| 2007/0202660 A1 | 8/2007 | Moriceau et al. | |
| 2007/0231931 A1 * | 10/2007 | Ecarnot et al. | 438/14 |
| 2007/0259528 A1 | 11/2007 | Moriceau et al. | |
| 2007/0281445 A1 | 12/2007 | Nguyen et al. | |
| 2008/0254591 A1 | 10/2008 | Deguet et al. | |
| 2009/0120568 A1 | 5/2009 | Deguet et al. | |
| 2009/0130392 A1 | 5/2009 | Aspar et al. | |
| 2009/0156016 A1 | 6/2009 | Di Cioccio | |
| 2009/0179226 A1 * | 7/2009 | Teo et al. | 257/190 |
| 2010/0025228 A1 | 2/2010 | Tauzin et al. | |
| 2010/0167499 A1 | 7/2010 | Fournel et al. | |
| 2010/0216294 A1 | 8/2010 | Rabarot et al. | |
| 2010/0323497 A1 | 12/2010 | Fournel | |

FOREIGN PATENT DOCUMENTS

| | | |
|---|---|---|
| EP | 0 383 391 A1 | 8/1990 |
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 895 282 A2 | 2/1999 |
| EP | 0 898 307 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 1 096 259 A1 | 5/2001 |
| EP | 0 717 437 B1 | 4/2002 |
| EP | 0 786 801 A1 | 6/2003 |
| EP | 0 767 486 B1 | 1/2004 |
| EP | 1 403 684 | 3/2004 |
| EP | 0 925 888 B1 | 11/2004 |
| FR | 2 681 472 | 9/1991 |
| FR | 2 671 472 A1 | 7/1992 |
| FR | 2 681 472 | 3/1993 |
| FR | 2 558 263 | 7/1995 |
| FR | 2 725 074 | 3/1996 |
| FR | 95 08882 | 6/1996 |
| FR | 2 736 934 | 1/1997 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 767 604 | 2/1999 |
| FR | 2 771 852 A1 | 6/1999 |
| FR | 2 773 261 | 7/1999 |
| FR | 2 774 510 A1 | 8/1999 |
| FR | 2 781 925 A1 | 2/2000 |
| FR | 2 789 518 A1 | 8/2000 |
| FR | 2 796 491 | 1/2001 |
| FR | 2 797 347 | 2/2001 |
| FR | 2 809 867 | 12/2001 |
| FR | 2 819 099 A1 | 7/2002 |
| FR | 2 847 075 A1 | 5/2004 |
| FR | 2 848 337 A1 | 6/2004 |
| FR | 2 861 497 | 4/2005 |
| GB | 2 211 991 A | 7/1989 |
| JP | 53-104156 | 9/1978 |
| JP | 58 31519 | 2/1983 |
| JP | 59-54217 | 3/1984 |
| JP | 61-129872 A | 6/1986 |
| JP | 62265717 | 11/1987 |
| JP | 101004013 | 1/1989 |
| JP | 01-128570 A | 5/1989 |
| JP | 01-169917 A | 7/1989 |
| JP | 08017777 | 1/1990 |
| JP | 4199504 | 7/1992 |

(56) References Cited

FOREIGN PATENT DOCUMENTS

| | | |
|---|---|---|
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11-233449 A | 8/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 02/084721 A1 | 10/2002 |
| WO | WO 02/084722 A1 | 10/2002 |
| WO | WO 03/013815 A1 | 2/2003 |
| WO | WO 03/021667 A2 | 3/2003 |
| WO | WO 03/032384 A1 | 4/2003 |
| WO | WO 03/063213 A2 | 7/2003 |
| WO | WO04/001810 | 12/2003 |
| WO | WO 2004/042779 A2 | 5/2004 |
| WO | WO 2004/044976 A1 | 5/2004 |
| WO | WO 2004/059711 A1 | 7/2004 |
| WO | WO 2004/061944 A1 | 7/2004 |
| WO | WO 2004/064146 A1 | 7/2004 |
| WO | WO 2005/000733 A2 | 1/2005 |
| WO | WO 2005/001915 A2 | 1/2005 |
| WO | WO 2005/013318 A2 | 2/2005 |
| WO | WO 2005/019094 A1 | 3/2005 |
| WO | WO 2005/043615 A1 | 5/2005 |
| WO | WO 2005/043616 A1 | 5/2005 |
| WO | WO 2007/020351 A1 | 2/2007 |
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

International Search Report, Jan. 24, 2007.
PCT Request in French.
PCT Preliminary Examination Report in French, Jan. 15, 2008.
Leterte, et al., "Germanium-On-Insulator (GeOI) structure realized by the Smart Cut™ technology", Mat. Res. Soc. Symp. Proc. vol. 809, 2004.
Deguet, et al., "200 MM Germanium-On-Insulator (GEOI) Structures Realized from Epitaxial Wafers Using the Smart Cut™ Technology", ECS 2005, Quebec, vol. 2005-05, p. 78.
Hartmann, et al., "Reduced pressure-chemical vapor deposition of intrinsic and doped Ge layers on Si(001) for microelectronics and optoelectronics purposes", Journal of Crystal growth 274 (2005) 90-99.
Huang, et al., Calculation of critical layer thickness considering thermal strain in $Si_{1-x}Ge_x/Si$ strained-layer heterostructures, J. Appl. Phys. 83 (1), Jan. 1, 1998.
Agarwal et al, "Efficient Production of Silicon-On-Insulator Films by Co-Implantation of HE+ with H+", Applied Physics Letters, vol. 72, No. 9, 1988, pp. 1086-1088.
Agarwal, Aditya et al. "Efficient Production of Silicon-On-Insulator Films by Co-Implantation of $He^+$ with $H^+$"—Proceedings 1997 IEEE International SOI Conference, Oct. 1997—pp. 44-45.
Ahn, K. Y., et al., "Growth, Shrinkage, And Stability of Interfacial Oxide Layers Between Directly Bonded Silicon Wafers", Applied Physics A., vol. 50, 1990, pp. 85-94.
Alley et al., "Surface Roughness Modification of Interfacial Contacts In Polysilicon Microstructures", Proceedings of the $7^{th}$ International Conference on Solid-State Sensors and Actuators, Transducers '93, PACIFICO, Yokohama Japan. Jun. 7-10, 1993, pp. 288-291.
Almedia et al. "Bond formation in ion beam synthesized amorphous gallium nitride", Elsevier, This Solid Films, 343-344 1999, pp. 632-636.
Ascheron, C., "A Comparative Study of Swelling, Radiation, Strain and Radiation Damage of High-Energy Proton-bombarded GaAs, GaP, InP, Sl and Ge Single Crystals, Nuclear Instruments and Methods in Physics Research", Nuclear Instruments and Methods In Physics Research B36, (1989), 1637172.
Ascheron, C., "A Study of Proton Bombardment Induced Swelling of GaP Single Crystals", Phys. stat. sol. (a) 92, (1985), pp. 169.
Ascheron, C., "Gettering a Copper in Proton- and Helium-Bombarded Buried Regions of Gallium Phosphide", Phys. stat. sol. (a), vol. 106, 1988, pp. 73-79.
Ascheron, C., "Investigations of Hydrogen Implanted GaP Single Crystals by Means of Particle Induced 7-Spectroscopy, Infrared Spectroscopy, and Turyherford Backscattering Channeling Technique" Phys. stat. sol. (a) 89, (1985), pp. 549.
Ascheron, C., "Proton Beam Modification of Selected AIIIBV Compounds", Phys. stat. sol. (a) 124, (1991), pp. 11.
Ascheron, C. et al, "Proton Bombardment Induced Swelling of GaP", 1985, pp. 169-176.
Ascheron, C., "Swelling, Strain, and Radiation Damage of He+ Implanted GaP", Phys. stat. sol. (a) 96, 1986, pp. 555-562.
Asheron, C., "The Effect of Hydrogen Implantation Induced Stress on GaP Single Crystals", Nuclear Instruments and Methods in Physics Research, B28 (1987), pp. 350-359.
Aspar et al., "The Generic Nature of the Smart-Cut © Process for Thin-Film Transfer", Journal of Electronic Materials, vol. 30, No. 7, Mar. 2001, pp. 834-840.
Aspar et al., Smart-Cut®: The basic fabrication process for UNIBOND® SOI wafers, SEMI 1996, pp. 37-46.
Aspar et al., U.S. Appl. No. 09/777,516, also Pub. No. US 2001/0007789 A1 with copy of allowed claims, Published Jul. 12, 2001.
Aspar et al., U.S. Appl. No. 10/784,601, including pending claims, filed Feb. 23, 2004.
Aspar, B. "Basic Mechanisms Involved in the Smart-Cut Process", 1997, pp. 223-240.
Aspar, B. et al, "Characterization of SOI substrates: Application to Recent SIMOX and UNIBOND Wafers," Electrochemical Society Proceedings, vol. 96-3, pp. 99-111.
Aspar, B. et al, "Transfer of Structured and Patterned Thin Silicon Films Using the Smart-Cut Process", 1996, pp. 1985-1986.
Aspar, B. Et al., "Ultra Thin Buried Oxide Layers Formed By Low Dose SIMOX Processes", Proc. $6^{th}$ International Conference on SOI Technology and Devices, Electro. Soc., vol. 94, No. 11, 1994, pp. 62.
Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.
Ashurst et al., "Water Level Anti-Silicon Coatings For MEMS", Sensors and Actuators A104, 2003, pp. 213-221.
Auberton-Herve, A. J. et al, "A New Sal Material: Smart-Cut", 1996, pp. 214-219.
Auberton-Herve, A.J. et al, "SOI Materials for ULSI Applications", Semiconductor International, Oct. 1995, 5 pps.
Blanchard-Lagahe C. et al., "Hydrogen and Helium Implantation to Achieve Layer Transfer" vol. 19, pp. 346-358, 2003, Semiconductor Wafer Bonding VII: Science, Technology, and Applications—Proceedings of the International Symposium.
Blöchl P.E. et al., First-Principles Calculations of Diffusion Coefficients: Hydrogen in Silicon, Physical Review Letters, vol. 64, No. 12, 1990, pp. 1401-1404.
Borgati, Stephen P., "The Root-Mean-Square", Boston College, Nov. 16, 1998, Obtained from the Internet at: <http://www.analytictech.com/mb313/rootmean.htm>.
Bruel, M. et al., (vol. 99-1) Meeting Abstract No. 333, "Single Crystal Semiconductor Layer Delamination and Transfer Through Hydrogen

(56) References Cited

OTHER PUBLICATIONS

Implantation", The 195th Meeting of the Electrochemical Society, May 2-6, 1999, Seattle, Washington.

Bruel, Michel, "Application of Hydrogen Ion Beams To Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, col. 36, Part 1, No. 3B.

Bruel, M. "Smart-Cut Process: The Way to Unibond S.O.I. Wafers", 1996, pages unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut—a new SOI Material Technology based on hydrogen Implantation and wafer bonding," *CEA*, 1996, 24 pages.

Bruel, M., "Silicon on insulator Material Technology", *Electronic Letters*; 31 (Jul. 6, 1995); No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen In Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted In Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen- or—Helium-Implanted (or Co-Implanted) Silicon", *Materials Science and Engineering*, B71, 2000, pp. 196-202.

Cerofolini et al., "Hydrogen and Helium Bubbles In Silicon", *Material Science and Engineering 2000*—Reports: A Review Journal, Published By Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation In Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B In Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon," *J. Appl. Phys.*, 49(10), Oct. 1978, pp. 5188-5198.

Dhara et al, "Mechanism of nanoblister formation in Ga+ self-ion implanted GaN nanowires", *Applied Physics Letters*, vol. 86, No. 20, 2005, p. 203199.

Demeester, et al., "Epitaxial Lift-Off And Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

DiCioccio et al., "III-V Layer Transfer Onto Silicon and Applications", *Phys. Stat. Sol. (a)*, vol. 202, No. 4, 2005 pp. 509-515.

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk To Surface Micromachining, A New Age For Silicon Sensors and Actuators", *Sensors and Actuators*, vol. A 46-47, 1995, pp. 8-16.

Dirks, A. G. et al., "Columnar Microstructure In Vapor DEuropesited Thin Films", *Thin Solid Films*, vol. 47, 1977, pp. 219-233.

Duo, et al., "Comparison Between The different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya And Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress In Surface Deformation of He-Implanted Surfaces" *Journal of Applied Physics*, vol. 48, No. 1, Jan. 1977, pp. 9-17.

Evans, J.H., "An Interbubble Fracture Mechanism Of Blister Formation On Helium-Irradiated Metals" *Journal of Nuclear Materials*, 68, 1977, pp. 129-140.

Feijoo et al., "Prestressing of Bonded Wafers", vol. 92-7, 1992, pp. 230-238.

Feng et al., "Generalized Formula For Curvature Radius and Layer Stresses Caused By Thermal Strain In Semiconductor Multilayer Structures", *J. Appl. Phys.*, vol. 54, No. 1, 1983, pp. 83-85.

French Search Report, FA 641570; FR 0312621, Jul. 19, 2004.

Fujitsuka et al., "A New processing Technique To Prevent Stiction Using Silicon Selective Etching For SOT-MEMS", *Sensors and Actruators*, A97-98, 2002, pp. 716-719.

Garnier, D. M., "The Fabrication Of A Partial Soi Substrate", Proceedings of the 9th International Symposium On Silicon On Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles—Silicon And Gallium Arsenide", *Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization By Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, 28, Aug. 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23,(Oct. 1984), No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Hulett, D.M. et al., "Ion Nitriding and Ion Implantation: A Comparison," *Metal Progress*, 1985, pp. 18-21.

(56) References Cited

OTHER PUBLICATIONS

IBM Technical Disclosure Bulletin, *Isolation by Inert Ion Implantation*, 1986, vol. 29 No. 3, pp. 1416.
IBM Technical Disclosure Bulletin, *SOI Interposer Structure* XP 000627972, Jul. 1996, vol. 39 No. 7, pp. 1-5.
International Search Report, PCT/FR2004/002779, Mar. 23, 2005.
International Search Report, PCT/FR2004/002781, Mar. 23, 2005.
Japanese Office Action dated Oct. 25, 2007 for JAPANese Patent Application No. 2002-581572.
Jaussaud, C. et al., Microstructure of Silicon Implanted With High Dose Oxygen Ions, *Appl. Phys. Lett.*, vol. 48, No. 11, 1985, pp. 1064-1066.
Johnson, "High Fluence Deuteron Bombardment of Silicon", *Radiation Effects*, vol. 32, pp. 159-167.
Jones, K. S. et al., "A Systematic Analysis of Defects In Ion Implanted Silicon", *Applied Physics A.*, vol. 45, 1988 pp. 1-34.
Jones et al., "Enhanced elimination of implantation damage upon exceeding the solid solubility", *J. App. Phys.*, vol. 62, No. 10, 1987, pp. 4114-4117.
Kamada et al, Observation of Blistering and Amorphization on Germanium Surface After 450 keV Ar+ION Bombardment, *Radiation Effects*, vol. 28, 1976, pp. 43-48.
Klem, J.F., "Characteristics of Lift-Off Fabricated AlGaAs/InGaAs Single-Strained-Quantum Well Structures On Glass and Silicon Substrates", *Inst. Phys. Conf.* Ser. No. 96: Chapter 6, (1989), pp. 387-392.
Komarov et al., Crystallographic Nature and Formation Mechanisms of Highly Irregular Structure in Implanted and Annealed S1, Layers*Radiation Effects*, vol. 42, 1979, pp. 169-178.
Kucheyev et al., "Ion Implantation Into GaN", *Materials Science and Engineering*, vol. 33, 2001, pp. 51-107.
Laporte A. et al., "Charged Defects At The Interface Between Directly Bonded Silicon Wafers"—Applied Physics, vol. 36 (Sep. 1997) pp. 5502-5506—Part 1, No. 9A.
Li, J., "Novel Semiconductor Substrate Formed by Hydrogen Ion Implantation into Silicon," Appl. Phys. Lett., vol. 55, No. 21, Nov. 20, 1989, pp. 2223-2224.
Ligeon, E., "Hydrogen Implantation in Silicon Between 1.5 and 60 KeV", *Radiation Effects 1976*, vol. 27, pp. 129-137.
Liu et al., "Investigation of Interface In Silicon-On-Insulator By Fractual Analysis", *Applied Surface Science*, vol. 187, Feb. 28, 2002, pp. 187-191.
Liu et al. "Ion Implantation In GaN At Liquid-Nitoigen Temperature: Structural Characteristics and Amorphization", *Physical Review B of The American Physical Society*, vol. 57, No. 4, 1988, pp. 2530-2535.
Lu, X., et al., "SOI Material Technology Using Plasma Immersion Ion Implantation", Proceedings 1996 IEEE International SOI Conference, Oct. 1996, pp. 48-49.
Maleville, C. et al, "Physical Phenomena involved in the Smart-Cut Process", *Electrochemical Society Proceeding*, vol. 96-3, 1996—pp. 34-46.
Maleville, C. et al, "Wafer Bonding and Hi-Implantation Mechanisms Involved In The Smart-Cut Technology", 1997, pp. 14-19.
Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.
Mastrangelo, C. et al., "Suppression of Stiction in MEMS", *Proceedings of the Materials Research Society Seminar*, vol. 605, 2000, pp. 1-12.
Matsuda et al., "Large Diameter Ion Beam Implantation System," *Nuclear Instruments and Methods*, vol. B21, 1987, pp. 314-316.
Matsuo et al., "Abnormal solid solution and activation behavior in GA-implanted Si(100)", *Appl. Phys. Lett.*, vol. 51, No. 24, 1987, pp. 2037-2039.
Materne, A. et al., "Changes in Stress and Coercivity After Annealing Of Amorphous Co (Zr, Nb) Thin Films DEuropesited By R. F. Sputtering", donloaded on Apr. 24, 2009, pp. 1752-1754.
Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.
Miyagawa, S. et al, "Helium Reemission During Implantation of Silicon Carbide", 1982, pp. 2302-2306.
Miyagawa, S., "Surface structure of silicon carbide Irradiated with helium ions with mono energy and continuous energy distributions" *J. Appl. Phys.* 53(12), Dec. 1982, pp. 8697-8705.
Monemar, B. "Shallow Impurities in Semiconductors 1998", Proceedings of the Third International Conference in Sweden, Aug. 10-12, 1988, No. 95, pp. 493-499.
Moreau, Wayne M., "Semiconductor Lithography, Principles, Practices, and Materials," Plenum Press, 1988. Table of Contents only.
Moriceau, H. et al, A New Characterization Process Used to Qualify SOI Films 1991 pp. 173-178.
Moriceau, H. et al, "A New Characterization Process Used to Qualify SOI Films", 1991 pp. 173-178.
Moriceau, H. et al. "Cleaning and Polishing As Key Steps For Smart-Cut SOI Process", Proceedings 1996 IEEE SOI Conference, Oct. 1996.
Moriceau, H. et al, "The Smart-Cut Process as a Way to Achieve Specific Film Thickness in Sal Structures", 1997, pages unknown.
Moriceau et al., (vol. 99-1) Meeting Abstract No. 405, "A New Characterization Process Used To Qualify SOI Films", The 195$^{th}$ Meeting of the Electrochemical Society, May 2-6, 1999, Seattle, Washington.
Munteanu, D. et al, "Detailed Characterization of Unibond Material", 1997, pp. 395-398.
Myers, D. R., "The effects of Ion-Implantation damage on the first order Raman spectra GaPa)" *J. Appl. Phys.* 54(9), Sep. 1977.
Nethling. J. et al, "Identification of Hydrogen Platelets in ProtonBombarded GaAs", 1985, pp. 941-945.
Nichols C. S et al., "Properties of Hydrogen in Crystalline Silicon Under Compression and Tension", *Physical Review Letters*, vol. 63, No. 10, 1989, pp. 1090-1093.
Nicoletti, S. et al., "Bi-Epitaxial YBCO Grain Boundry Josephson Junctions on SrTiO3 and Sapphire Substrates", *Physics C269*, 1996, pp. 255-267.
Office Action (Non-Final) for U.S. Appl. No. 10/474,984—Dated Sep. 24, 2004.(16).
Office Action (Non-Final) for U.S. Appl. No. 10/474,984—Dated Jun. 6, 2005. (16).
Office Action (Non-Final) for U.S. Appl. No. 10/474,984—Dated Nov. 16, 2005. (16).
Office Action (Non-Final) for U.S. Appl. No. 10/474,984—Dated May 17, 2006. (16).
Office Action (Non-Final) for U.S. Appl. No. 10/474,984—Dated May 7, 2007. (16).
Office Action (Non-Final) for U.S. Appl. No. 10/474,984—Dated Feb. 6, 2008. (16).
Office Action (Final) for U.S. Appl. No. 10/474,984—Dated Oct. 17, 2008. (16).
Office Action (Non-Final) for U.S. Appl. No. 10/474,984—Dated Jul. 7, 2009. (16).
Ono et al., "Orientation Dependence of Flaking of Ion Irradiated Aluminum Single Crystals", *Japanese Journal of Applied Physics*, vol. 25, No. 10, 1986, pp. 1475-1480.
Paszti, E, "Flaking and Wave-Like Structure on Metallic Glasses Induced by MeV-Energy Helium Ions", *Nuclear Instruments and Methods*, vol. 209/210, (1983), pp. 273-280.
Picraux, S. Thomas et al., "Ion Implantation of Surfaces," *Scientific American*, vol. 252, No. 3, pp. 102-113 1985.
Pollentier, et al., "Fabrication of High-Radiance LEDs by Epitaxial Lift-Off", *SPIE*, vol. 1361, 1990, pp. 1056-1062.
Popov, V.P. et al., "Blistering On A Silicon Surface in the Process of Sequential Hydrogen/Helium Ion Co-Iplantation"—Optoelecironics Instrumentation and Data Processing, No. 3, Apr. 5, 2001—pp. 90-98—2001.
Primak, W., "Impurity Effect in the Ionization Dilation of Vitreous Silica" *J. Appl. Phys.* 39(13) 1968.
Reissue U.S. Appl. No. 10/449,786.

(56) References Cited

OTHER PUBLICATIONS

Renier, M. et al., "A New Low-Energy Ion Implanter for Bombardment of Cylindrical Surfaces," *Vacuum*, vol. 35, No. 12, pp. 577-578, 1985.
Roth, J., "Blistering and Bubble Formation" *Inst. Phys. Conf.* Ser. No. 28, 1976: Chapter 7, pp. 280-293.
Sah, Chih-Tang et al., "Deactivation of the Boron Acceptor in Silicon by Hydrogen," *Appl. Phys. Lett.* 43, (2), Jul. 1983, pp. 204-206.
Saint-Jacques R. G., "La Formation des Cloques", *Nuclear Instruments and Methods*, No. 209/210, North Holland Publishing Co., 1983, pp. 333-343.
Schnell et al., "Plasma Surface Texturization for Multicrystaline Silicon Solar Cells", *IEEE*, XXVIII, Photovoltaic Conference, 2000, pp. 367-370.
Shintani, A. et al., "Temperature dependence of stresses in chemical deposited vitreous films", *J. Appl. Phys.*, vol. 51, No. 8, 1980, pp. 4197.
Silicon-On-Insulator, *European Semiconductor*, Mar. 1997, pp. 17 and 18.
Sioshansi, Piran, "Ion Beam Modification of Materials for Industry," *Thin Solid Film*, vol. 118, 1984, pp. 61-71.
Snyman, H. C., "Transmission Electron Microscopy of Extended Crystal Defects in Proton Bombarded and Annealed GaAs", *Radiation Effects*, 1983, vol. 69, pp. 199-230.
Snyman, H. C. et al, "Void Formation in Annealed Proton-Bombarded GaAs", 1981, pp. 243-245.
Stein, Myers and Follstaedt, "Infrared Spectroscopy of chemically bonded hydrogen at voids and defects in silicon", *J. Appl. Phys.* 73(b6), Mar. 15, 1993, pp. 2755-2764.
Stephen, D., "Investigation of Lattice Strain in Proton-Irradiated GaP by a Modified Auleytner Technique" *Phys. stat. sol.* (a) 87, 1985, pp. 589-596.
Sunkara et al., "Bulk synthesis of silicon nanowires using a low-temperature vapor-liquid-solid solution", *Applied Physics Letters*, vol. 79, No. 10, Sep. 3, 2001, pp. 1546-1548.
Suzuki et al., "High-Speed and Low Power n+-p+ Double-Gate SOI CMOS", *IEICE Trans. Electron.*, vol. E78-C, No. 4, 1995, pp. 360-367.
Sze, S.M., VLSI Technology, 2.sup.nd Ed., 1988, pp. 9-10.
Tan, T. Y. et al., "On Oxygen Precipitation Retardation/Recovery Phenomena, Nucleation Incubation Phenomena and The Exigent-Accomodation-Volume Factor of Precipitation", Proceedings of the 5$^{th}$ International Symposium On Silicon Materials Science and Technology, *Semiconductor Silicon 198 Electrochem. Soc.*, New Jersey, 1986, pp. 864-873.
Terada, K. et al., "A New Dram Cell With A Transistor On A Lateral Epitaxial Silicon Layer (Tole Cell)", *IEEE Transactions On Electron Device*, vol. 37, No. 9, 1990, pp. 2052-2057.
Terreault, Bernard, "Hydrogen Blistering of Silicon: Progress In Fundamental Understanding", *Phys. Stat. Sol.* (a) 204, No. 7, 2007, pp. 2129-2184.
Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-159.
Timoshenko, S. et al., "Analysis of Bi-Metal Thermostats", *J. Opt. Soc. Am.*, vol. 11, 1925, pp. 233-256.
Tong et al., "Low Temperature SI Layer Splitting", Proceedings 1997 IEEE International SOI Conference, Oct. 1997, pp. 126-127.
Tonini, Monelli, Cornl, Ottaviani, Frabboni, Canteri, Queirolo, "Hydrogen Interaction with phosphorus ion implantated silicon", *Ion Implantation Technology—94*, (1995) pp. 801-804.
Tzeng, J.C., "A Novel Self-Aligned Oxgyen (Salox) Implanted SOI Mosfet Device Structure" *Nuclear Instruments and Methods in Physics Research* B2, 1987, pp. 112-115.
U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.
Van de Walle, C. "Theoretical Aspects of Hydrogen in Crystalline Semiconductors", *Physica B*, Holland, vol. 170, No. 15, 1991, pp. 21-32.
Van de Walle, C. "Theory of Hydrogen Diffusion and Reactions in Crystalline Silicon", *Physical Review Letters*, vol. 64, No. 6, 1980, pp. 669-672.
Van de Walle, C. "Theory of Hydrogen Diffusion and Reactions in Crystalline Silicon", *Physical Review B*, vol. 39, No. 15, 1989, pp. 10 791-10 808, plus diagrams.
Van Swijgenhoven et al. "Helium Bubble and Blister Formation for Nickel and An AMorphous Fe-Ni-Mo-B Alloy During 5 kev He-+-Irradiation at Temperatures Between 200 K and 600", *Nuclear Instruments and Methods*, 209/210, 1983, pp. 461-468.
Veldkamp, W.B. et al., "Binary Optics," *Scientific American*, 1992, pp. 50-55.
Venezia et al., "The Role of Implantation Damage in the Production of Silicon-On-Insulator Films By Co-Implantation Of $He^+$ and $H^+$", Electrochemical Society Proceedings vol. 98-1, 1998—pp. 1384-1395.
Weldon et al., "Mechanism Of Silicon Exfoliation Induced by Hydrogen/Hekium Co-implantation", *Applied Physics Letters*, vol. 73, No. 25, pp. 3721-3723, Dec. 21, 1998.
Wemple, S.H., "Optical and channeling studies of ion-bombarded GaP", *J. Appl. Phys.*, vol. 45, No. 4, Apr. 1974, pp. 1578-1588.
Whitton, J. L. et al., "The Collection of Ions Implanted In Semiconductors: 1 Saturations Effects", *Radiation Effects*, Scotland, vol. 16, 1972, pp. 101-105.
Wiegand, M. et al., "Wafer Bonding of Silicon Wafers Covered With Various Surface Layers", *Sensors and Actuators*, Elsevier Science B.V., vol. 86, 2000, pp. 91-95.
Williams J. et al., "Annealing behaviour of high-dose rare-gas implantations into silicon", from Application of Ion Beans to Materials, 1975, Chap. 1, *Inst. Phys. Conf. Ser. No. 28*, 1976, pp. 30-36.
Wittmaack et al., "High Fluence Retention of Noble Gases Implanted in Silicon" *Radiation Effects*, vol. 39, 1978, pp. 81-95.
Wolf, Stanley Ph.D., Silicon Processing for the VLSI Era (vol. 2), Lattice Press, 1990, pp. 66-79.
Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.
Yamaguchi H. et al., "Intelligent Power IC With Partial Soi Structure", *Jpn. J. Appl. Phys.*, vol. 34, 1995, pp. 864-868.
Yee et al., "Polysilicon Surface-Modification Technique to Reduce Sticking of Microstructures", *Sensors and Actuators* A 52, 1996, pp. 145-150.
Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.
Yun et al., "Thermal and Mechanical Separations of Silicon Layers From Hydrogen Pattern-Implanted Wafers", *Journal of Electronic Materials*, vol. 38, No. 8, Apr. 24, 2001, pp. 960-964.
Yun, H. et al., "Transfer of Patterned Ion-Cut Silicon Layers", *Applied Physics Letters*, vol. 73, No. 19, 1998, pp. 2772-2774.
U.S. District Court District of Delaware (Wilmington) Civil Docket For Case #: 1:08-cv-00292-SLR—(19 pgs).
Complaint filed with Jury Demand against MEMC Electronic Materials Inc.—Magistrate Consent Notice to Pltf. ( Filing fee $ 350, receipt No. 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Nos. RE39,484 E; 6,809,009; 7,067,396 B2; (sns, ) (Entered: May 20, 2008) (1 pg).

(56) References Cited

OTHER PUBLICATIONS

Summons Returned Executed by SOITEC Silicon On Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).
Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008) Redacted Reply Brief re 14-re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Redacted Reply Brief re 14-re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon On Insulator Technologies SA, Commissariat a L'Energie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc. (Rogowski, Patricia) (Entered: Mar. 6, 2009) (3 pgs).
Proposed Order Proposed Scheduling Order re 16 Memorandum and Order, Set Hearings, by SOITEC Silicon On Insulator Technologies SA, Commissariat a 'LEnergie Atomique. (Kraft, Denise) (Entered: Mar. 10, 2009) (7 pgs).
Letter to The Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon On Insulator Technologies SA, Commissariat a L'Energie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon On Insulator Technologies SA, Commissariat a L'Energie Atomique. (Kraft, Denise) (Entered: Mar. 12, 2009) (7 pgs).
Letter to The Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Sili-

(56) References Cited

OTHER PUBLICATIONS con On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat A L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat A L'Energie Atomique by MEMC Electronic Materials Inc. (Rogowski, Patricia) (Entered: Apr. 14, 2009) (3 pgs).
Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc. (Rogowski, Patricia) (Entered: Apr. 21, 2009) (3 pgs).
Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).
Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a 'LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests For Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation To Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request For Production of Documents and Things; (3) CEAs Objections and Responses to MEMC's First Set of Interrogatories; and (4) CEAs Objections and Responses to MEMC's First Request For Production of Documents and Things by SOITEC Silicon On Insulator Technologies SA, Commissariat a L'Energie Atomique. (Attachments: # 1 Certificate of Service) (Kraft, Denise) (Entered: May 29, 2009).
Stipulation To extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests For Production of Documents and Things (Nos. 133-135) re 41 Notice of Service,, by SOITEC Silicon On Insulator Technologies SA, Commissariat a LEnergie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).
Notice of Service of MEMC's Second Request for Production of Documents and Things Directed to S.O.I.TEC Silicon on Insulator Technologies, S.A. and Soitec USA, Inc. by MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).
Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon On Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).
Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request For Production of Documents and Things Directed To Soitec re 46 Notice of Service by SOITEC Silicon On Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon On Insulator Technologies SA, Commissariat a L'Energie Atomique re 51 Notice of Service, (Attachments: # 1 Certificate of Service)(Kraft, Denise) (Entered: Jul. 17, 2009).

(56) References Cited

OTHER PUBLICATIONS

Notice of Service of SOITEC's Objections and Responses to MEMC's Second Request for Production of Documents and Things Directed to SOITEC re 46 Notice of Service by SOITEC Silicon On Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).
Notice of Service of MEMC Electronic Materials, Inc.'s Second Set of Interrogatories Directed to S.O.I.TEC Silicon on Insulator Technologies, S.A., SOITEC USA, Inc. and Commissariat A L'Energie Atomique by MEMC Electronic Materials Inc..(Rogowski, Patricia) (Entered: Jul. 17, 2009).
Notice of Service of Soitec's Production of Documents Bates Numbered SCEA 00000001 to SCEA 00002442 by SOITEC Silicon On Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).
Notice of Service of MEMC's Production of Documents Bates Numbered MEMC0300000 to MEMC0306530 by MEMC Electronic Materials Inc. (Rogowski, Patricia) (Entered: Jul. 20, 2009).
First Amended Complaint for Patent Infringement against MEMC Electronic Materials Inc.—filed by SOITEC Silicon On Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Notice of Service of Soitec S.A.'s Second Set of Interrogatories (Nos. 18-22) and CEA's First Set of Interrogatories (Nos. 1-11) by SOITEC Silicon On Insulator Technologies SA, Commissariat a L'Energie Atomique. (Attachments: # 1 Certificate of Service)(Kraft, Denise) (Entered: Jul. 23, 2009).
Notice of Service of S.O.I.TEC Silicon on Insulator Technologies, S.A. and Commissariat a Lenergie Atomique Supplemental Production of Documents Bates Numbered SLIT 00000001 to SLIT 00049728 re 43 Notice of Service, by SOITEC Silicon On Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Notice of Service of MEMC's Production of Documents Bates Numbered MEMC0300000-MEMC0337055 by MEMC Electronic Materials Inc. (Rogowski, Patricia) (Entered: Aug. 5, 2009).
Notice of Service of S.O.I.TEC Silicon on Insulator Technologies, S.A. and Commissariat a L Energie Atomique's Revised Supplemental Production of Documents Bates Numbered SLIT00000001-SLIT0004886; SLIT00004931 SLIT00004985; SLIT00005169 SLIT00005174; SLIT00005241 SLIT00006368; and SLIT00006886-SLIT00049728 re 59 Notice of Service, by SOITEC U.S.A., Inc., SOITEC Silicon On Insulator Technologies SA, Commissariat a LEnergie Atomique. Related document: 59 Notice of Service, filed by SOITEC Silicon On Insulator Technologies SA, Commissariat a LEnergie Atomique. (Attachments: # 1 Certificate of Service)(Kraft, Denise) (Entered: Aug. 6, 2009).
Stipulation to Extend Time to Answer or Otherwise Respond to MEMC's Amended Counterclaims to Aug. 31, 2009—filed by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).
Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).
Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon On Insulator Technologies SA, SOITEC U.S.A., Inc., Commissariat a L'Energie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Aug. 26, 2009).
Notice of Service of MEMC's Supplemental Answers to SOITEC's First Set of Interrogatories by MEMC Electronic Materials Inc.. (Rogowski, Patricia) (Entered: Aug. 27, 2009) So Ordered—re 63 Stipulation to Extend Time. Set/Reset Answer Deadlines: SOITEC Silicon On Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).
Answer to 60 Answer to Amended Complaint, Counterclaim,,, Counterclaim *Reply to Defendant's Amended Counterclaims, Counterclaims And Affirmative Defenses* against MEMC Electronic Materials Inc. by SOITEC Silicon On Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).
Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).
Notice of Service of Soitec S.A.'s Third Set of Interrogatories (Nos. 23-27) re 58 Notice of Service, by SOITEC Silicon On Insulator Technologies SA, SOITEC U.S.A., Inc., Commissariat a LEnergie Atomique. Related document: 58 Notice of Service, filed by SOITEC Silicon On Insulator Technologies SA, Commissariat a LEnergie Atomique. (Attachments: # 1 Certificate of Service)(Kraft, Denise) (Entered: Sep. 22, 2009).
Notice of Service of MEMC Electronic Materials Inc.'s Answers to SOITEC S.A.'s Second Set of Interrogatories (Nos. 8-22) and MEMC Electronic Materials, Inc.'s Answers to CEA's First Set of Interrogatories (Nos. 1-11) by MEMC Electronic Materials Inc.. (Rogowski, Patricia) (Entered: Oct. 16, 2009).
Notice of Service of S.O.I.TEC Silicon on Insulator Technologies, S.A. and Commissariat a L'Energie Atomique's Supplemental Production of Documents Bates Numbered SOIT 00003529 to SOIT 00004244 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001-.009; (Con't)—SOIT 00003409.001-.015; and SOIT 00003469.001-.015 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).
Notice of Service of SOITEC/CEA Parties' Objections and Responses to MEMC Electronic Materials, Inc.'s Second Set of Interrogatories by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 16, 2009).

(56) References Cited

OTHER PUBLICATIONS

Notice of Service of S.O.I.TEC Silicon On Insulator Technologies, S.A. and Commissariat LEnergie Atomique Supplemental Production of Documents Bates Numbered SOIT 00004245 to SOIT 00205027 by SOITEC Silicon On Insulator Technologies SA, SOITEC U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).
Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Notice of Service of MEMC's Production of Documents Bates Numbered MEMC0338048-MEMC0345027 by MEMC Electronic Materials Inc..(Rogowski, Patricia) (Entered: Oct. 23, 2009).
Notice of Service of S.O.I.TEC Silicon On Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates number (lid) (Entered: Oct. 23, 2009).
Notice of Service of of S.O.I.TEC Silicon On Insulator Technologies, S.A. and Commissariat a L'Energie Atomique's Supplemental Production Of Documents Bates Numbered SOIT 00205028 to SOIT 00206175; SCEA 00002443 to SCEA 00003974; and SLIT 00060613 to SLIT 00063784 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of MEMC's Answers TOSOITEC S.A.'s Third Set of Interrogatories (Nos. 23-27) by MEMC Electronic Materials Inc.. (Rogowski, Patricia) (Entered: Oct. 28, 2009).
Notice of Service of S.O.I.TEC Silicon On Insulator Technologies, S.A. and Commissariat a L'Energie Atomique's Supplemental Production Of Documents Bates Numbered SOIT 00206176 to SOIT 00206183 by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of SOITEC/CEA Parties' Objections and Responses to MEMC Electronic Materials, Inc.'s Third Set of Interrogatories by SOITEC Silicon On Insulator Technologies SA, SOITEC U.S.A., Inc., Commissariat a LEnergie Atomique. (Attachments: # 1 Certificate of Service)(Kraft, Denise) (Entered: Oct. 29, 2009).
A. J. Auberton-Hervé, "Why Can Smart Cut® Change The Future Of Microelectronics?," Published in International Journal of High Speed Electronics and Systems, vol. 10, No. 1 (2000) pp. 131-146.
Ayguavives et al., "Physical Properties of (Ba,Sr) TiO$_3$ Thin Films Used for Integrated Capacitors in Microwave Applications", IEEE 2001.
Di Cioccio, L. et al., "*Silicon Carbide On Insulator Formation By The Smart Cut® Process*".—Materials Science and Engineering B46 (1997)—(pp. 349-356).
Donohue et al., "Pulse-Extended Excimer Laser Annealing of Lead Zirconate Titanate Thin Films", Proceedings of the 12$^{th}$ International Symposium on Integrated Ferroelectrics, Aachen, Germany, Mar. 2000, *Integrated Ferroelectics*, vol. 31, pp. 285 to 296, 2000.
Heistand et al., "Advances in Passive Integration for C/RC Arrays & Networks with Novel Thin & Thick Film Materials", 36$^{th}$ Nordic IMAPS Conference, Helsinki, 1999.
Hendrix et al., "Low-Temperature Process for High-Density Thin-Film Integrated Capacitors", International Conference on High-Density Interconnect and Systems Packaging, 2000.
Jalaguier, E. et al., "*Transfer of Thin InP Films Onto Silicon Substrate By Proton Implantation Process*".—11$^{th}$ International Conference on Indium Phosphide and Related Materials May 16-20, 1999—Davos, Switzerland. (pp. 26-27).
Jalaguier, E. et al., "*Transfer of 3in GaAs Film on Silicon Substrate By Proton Implantation Process*". Feb. 1998, pp. 408-409.
Jenei et al., "High-Q Inductors and Capacitors on Si Substrate", IEEE 2001.
Kim et al., "A Porous-Si-based Novel Isolation Technology for Mixed-Signal Integrated Circuits", Symposium on VLSI Technology, 2000.
Liu et al., "Integrated Thin Film Capacitor Arrays", International Conference on High Density Packaging and MCMs, 1999.
Motohiro et al. "*Geometrical Factors of Argon Incorporation In SiO$_2$ Films Deposited By Ion Beam Sputtering*"—Thin Solid Films, Elsevier-Sequoia S.A. Lausanne, CH, vol. 120, No. 4—Oct. 1, 1984, pp. 313-327.
Ray et al. "*Effect of Reactive-Ion Bombardment on the Properties of Silicon Nitride and Oxynitride Films Deposited By Ion-Beam Sputtering*"—Journal of Applied Physics, vol. 75, No. 12, Jun. 15, 1994— pp. 8145-8152.
Roozeboom et al., "High-Value MOS Capacitor Arrays in Ultradeep Trenches in Silicon", *Microelectronic Engineering*, vol. 53, pp. 581 to 584, Elsevier Science 2000.
Tillman et al., "Zero-Level Packaging for MEMS or MST Devices: The IRS Method", MEMS/Sensors, Advancing Microelectronics, pp. 37-39, Nov./Dec. 2000.
Tomisaka et al., "Electroplating Cu Fillings for Through-Vias for Three-Dimensional Chip Stacking" (Electronic Components and Technology Conference, Aug. 2002).
International Search Report for International Application No. PCT/FR1998/002904, dated Apr. 16, 1999, 2 pages.
International Search Report for International Application No. PCT/FR2002/001266, dated Feb. 7, 2003, 4 pages.
International Search Report for International Application No. PCT/FR2002/001268, dated Feb. 6, 2003, 4 pages.
International Search Report for International Application No. PCT/FR2002/003422, dated Jan. 22, 2003, 3 pages.
International Search Report for International Application No. PCT/FR2003/003256, dated Mar. 19, 2004, 6 pages.
International Search Report for International Application No. PCT/FR2003/003867, dated May 28, 2004, 3 pages.
International Search Report for International Application No. PCT/FR2003/003622, dated Jun. 3, 2004, 3 pages.
International Search Report for International Application No. PCT/FR2004/001858, dated Dec. 28, 2004, 3 pages.
International Search Report for International Application No. PCT/FR2004/002779, dated Apr. 5, 2005, 3 pages.
International Search Report for International Application No. PCT/FR2004/002781, dated Apr. 5, 2005, 3 pages.
International Search Report for International Application No. PCT/FR2004/001565, dated Jul. 6, 2005, 3 pages.
International Search Report for International Application No. PCT/FR2006/002184, dated Jan. 24, 2007, 2 pages.
International Search Report for International Application No. PCT/FR2007/000534, dated Nov. 22, 2007, 3 pages.
International Search Report for International Application No. PCT/FR2007/002100, dated Feb. 4, 2009, 3 pages.
International Search Report for International Application No. PCT/FR2008/001427, dated Jul. 1, 2009, 3 pages.
Office Action from U.S. Appl. No. 12/063,808, dated Sep. 22, 2010, 9 pages.

(56) References Cited

OTHER PUBLICATIONS

Advisory Action from U.S. Appl. No. 12/063,808, dated Jan. 21, 2011, 3 pages.
Office Action from U.S. Appl. No. 10/534,199, dated Feb. 19, 2009, 8 pages.
Office Action from U.S. Appl. No. 10/534,199, dated Aug. 5, 2009, 10 pages.
Office Action from U.S. Appl. No. 10/534,199, dated Jan. 20, 2010, 8 pages.
Office Action from U.S. Appl. No. 10/534,199, dated Aug. 4, 2010, 8 pages.
Office Action from U.S. Appl. No. 10/577,175, dated Jun. 22, 2009, 13 pages.
Office Action from U.S. Appl. No. 10/577,175, dated Apr. 13, 2010, 14 pages.
Office Action from U.S. Appl. No. 11/480,250, dated May 22, 2008, 10 pages.
Office Action from U.S. Appl. No. 11/480,250, dated Dec. 3, 2008, 16 pages.
Office Action from U.S. Appl. No. 11/480,250, dated Jan. 26, 2010, 14 pages.
Office Action from U.S. Appl. No. 11/480,250, dated Aug. 3, 2010, 15 pages.
Office Action from U.S. Appl. No. 12/088,047, dated Sep. 25, 2009, 9 pages.
Office Action from U.S. Appl. No. 12/088,047, dated Mar. 10, 2010, 9 pages.
Office Action from U.S. Appl. No. 10/561,299, dated Mar. 26, 2008, 9 pages.
Office Action from U.S. Appl. No. 10/561,299, dated Dec. 9, 2008, 11 pages.
Office Action from U.S. Appl. No. 10/561,299, dated May 11, 2009, 12 pages.
Office Action from U.S. Appl. No. 10/561,299, dated Nov. 16, 2009, 11 pages.
Office Action from U.S. Appl. No. 10/561,299, dated Nov. 27, 2009, 10 pages.
Office Action from U.S. Appl. No. 10/561,299, dated May 11, 2010, 11 pages.
Office Action from U.S. Appl. No. 10/565,621, dated May 15, 2007, 13 pages.
Office Action from U.S. Appl. No. 10/565,621, dated Feb. 11, 2008, 11 pages.
Office Action from U.S. Appl. No. 10/565,621, dated Sep. 12, 2008, 9 pages.
Office Action from U.S. Appl. No. 10/565,621, dated Mar. 12, 2009, 6 pages.
Office Action from U.S. Appl. No. 10/565,621, dated Jan. 7, 2010, 8 pages.
Office Action from U.S. Appl. No. 10/565,621, dated Nov. 23, 2010, 11 pages.
Office Action from U.S. Appl. No. 12/628,772, dated Oct. 7, 2010, 12 pages.
Notice of Allowance from U.S. Appl. No. 12/336,229, dated Sep. 29, 2010, 7 pages.
Notice of Allowance from U.S. Appl. No. 12/336,229, dated Jan. 10, 2011, 4 pages.
Office Action from U.S. Appl. No. 12/682,522, dated Mar. 29, 2011, 10 pages.
Office Action from U.S. Appl. No. 10/468,223, dated Oct. 5, 2005, 7 pages.
Office Action from U.S. Appl. No. 10/468,223, dated May 3, 2006, 11 pages.
Office Action from U.S. Appl. No. 10/468,223, dated Jan. 10, 2007, 11 pages.
Office Action from U.S. Appl. No. 10/468,223, dated Jul. 20, 2007, 11 pages.
Office Action from U.S. Appl. No. 10/468,223, dated Feb. 11, 2008, 11 pages.
Office Action from U.S. Appl. No. 10/468,223, dated Oct. 29, 2008, 11 pages.
Office Action from U.S. Appl. No. 10/468,223, dated Jun. 25, 2009, 8 pages.
Notice of Allowance from U.S. Appl. No. 10/468,223, dated Dec. 28, 2009, 4 pages.
Office Action from U.S. Appl. No. 10/474,984, dated Mar. 11, 2010, 13 pages.
Notice of Allowance from U.S. Appl. No. 10/474,984, dated Oct. 28, 2010, 6 pages.
Office Action from U.S. Appl. No. 10/540,303, dated Dec. 18, 2007, 6 pages.
Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities In Support of Soitec's Motion for Summary Judgment on Sigen's Enablement Invalidity Claim (Redacted) dated Mar. 27, 2001.
Soitec's Memorandum of Points and Authorities In Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.

(56) References Cited

OTHER PUBLICATIONS

Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. and Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. and Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant-Cross Appellant's Response To Appellants' Submission Of *CFMT, Inc.* v. *Yieldup Int'l*, [dated Nov. 24, 2003].
Decision from the United States Court of Appeals for the Federal Circuit dated Nov. 26, 2003.
Combined Petition for Panel Rehearing and for Rehearing En Banc by Plaintiffs-Appellant's Soitec, S.A. and Commissariat A L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Cross Motion to Bifurcate all Collateral Issues—filed by SOITEC Silicon On Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate all Collateral Issues, 77 Motion to Bifurcate the Issues of Willfulness and Damages for Purposes of Discovery and Trial and proposed Form of Order filed by SOITEC Silicon On Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 Motion to Bifurcate the Issues of Willfulness and Damages for Purposes of Discovery and Trial and proposed Form of Order filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate all Collateral Issues filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate all Collateral Issues filed by Commissariat a LEnergie Atomique, SOITEC Silicon On Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon On Insulator Technologies, S.A. and Commissariat a L'Energie Atomique's Production of Three Boxes of Wafer Samples by Commissariat a LEnergie Atomique, SOITEC Silicon On Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Motion for Leave to File Stipulated Motion for Leave to File a Sur-Reply Brief in Support of MEMC's Motion to Bifurcate—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery Motion for the Admission of the Expert Testimony of John T. Goolkasian Relating to the Certificate of Correction for U.S. Patent No. 7,067,396 filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery Motion for the Admission of the Expert Testimony of John T. Goolkasian Relating to the Certificate of Correction for U.S. Patent No. 7,067,396 Plaintiff's Answering Brief in Opposition to Defendant's Motion For the Admission of Expert Testimony of John T. Goolkasian filed by SOITEC Silicon On Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, Declaration of Marcus T. Hall in Support of Plaintiff's Answering Brief in Opposition to Defendant's Motion For the Admission of Expert Testimony of John T. Goolkasian by SOITEC Silicon On Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation Joint Claim Construction Statement by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Sur-Reply Brief re 141 Motion for Discovery Motion for the Admission of the Expert Testimony of John T. Goolkasian Relating to the Certificate of Correction for U.S. Patent No. 7,067,396 Surreply by Plaintiffs to Motion by Defendant For The Admission of Expert Testimony of John T. Goolkasian filed by SOITEC Silicon On Insu-

(56) References Cited

OTHER PUBLICATIONS lator Technologies SA. (Attachments: # 1 Certificate of Service)(Kraft, Denise) (Entered: Jun. 15, 2010).
Declaration re 157 Sur-Reply Brief, Declaration of Marcus T. Hall in Support of Surreply by Plaintiffs to Motion by Defendant For The Admission of Expert Testimony of John T. Goolkasian by SOITEC Silicon On Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief Plaintiffs S.O.I.TEC Silicon on Insulator Technologies, S.A. and Commissariat a L'Energie Atomique's Opening Claim Construction Brief filed by Commissariat a LEnergie Atomique, SOITEC Silicon On Insulator Technologies SA. (Attachments: # 1 Certificate of Service)(Kraft, Denise) (Entered: Jun. 25, 2010).
Declaration re 168 Claim Construction Opening Brief, Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0352, # 11 Appendix DA-0353-DA-0392, # 12 Appendix DA-0393-DA-0432, # 13 Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I—JA0001 to JA0533. Appendix vol. I. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
Vol. VI—JA2090 to JA2557. Original document(s) to be filed with the Clerk's Office. Notice filed by Denise Seastone Kraft on behalf of Commissariat a LEnergie Atomique, SOITEC Silicon On Insulator Technologies SA (Attachments: # 1 Certificate of Service)(Kraft, Denise) (Entered: Jun. 25, 2010).
Motion in Limine SOITEC/CEA Parties' Motion to Exclude The Expert Report of Dr. Pascal Bellon and Any Related Testimony—filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Motion for Partial Summary Judgment of Invalidity of the Asserted Aspar Patent Claims—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine SOITEC/CEA Parties' Motion to Exclude The Expert Report of Dr. Pascal Bellon and Any Related Testimony filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment of Invalidity of the Asserted Aspar Patent Claims filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine SOITEC/CEA Parties' Motion to Exclude The Expert Report of Dr. Pascal Bellon and Any Related Testimony Plaintiffs' Omnibus Appendix to Daubert Motion and Motions For Partial Summary Judgment Filed on Jul. 2, 2010 by Commissariat a LEnergie Atomique, SOITEC Silicon On Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment of Non-Infringement—filed by MEMC Electronic Materials Inc.. (Attachments: # 1 Text of Proposed Order, # 2 Certificate of Service)(Rogowski, Patricia) (Entered: Jul. 2, 2010).

(56) References Cited

OTHER PUBLICATIONS

Motion for Partial Summary Judgment SOITEC/CEA Parties Motion For Partial Summary Judgment That The Patents in Suit Satisfy The Written Description Requirement—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 202 Motion for Partial Summary Judgment SOITEC/CEA Parties Motion For Partial Summary Judgment That The Patents in Suit Satisfy The Written Description Requirement filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment Plaintiffs' Motion For Partial Summary Judgment That The Certificate of Correction For the '396 Patent is Valid—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 204 Motion for Partial Summary Judgment Plaintiffs' Motion For Partial Summary Judgment That The Certificate of Correction For the '396 Patent is Valid filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC/CEA Parties' Motion For Partial Summary Judgment That The Aspar Patents Are Not Invalid For Inequitable Conduct—filed by Commissariat a LEnergie Atomique, SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment SOITEC/CEA Parties' Motion For Partial Summary Judgment That The Aspar Patents Are Not Invalid For Inequitable Conduct filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment Plaintiffs' Motion For Partial Summary Judgment That The Bruel Patent Does Not Anticipate The Aspar Patents—filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment Plaintiffs' Motion For Partial Summary Judgment That The Bruel Patent Does Not Anticipate The Aspar Patents filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion For Partial Summary Judgment of Invalidity of United States Patent No. 5,834,812 For Lack of Enablement—filed by SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment SOITEC's Motion For Partial Summary Judgment of Invalidity of United States Patent No. 5,834,812 For Lack of Enablement filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion For Partial Summary Judgment For Invalidity of Asserted Claims of United States Patent No. 5,834,812 in View of Prior Art—filed by SOITEC Silicon On Insulator Technologies SA, SOITEC U.S.A., Inc..

(Attachments: # 1 Text of Proposed Order, # 2 Certificate of Service)(Kraft, Denise) (Entered: Jul. 2, 2010).
Motion for Partial Summary Judgment That the Best Mode Requirement is Satisfied for the Claims of the '009 and '396 Patents—filed by Commissariat a LEnergie Atomique, SOITEC Silicon On Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment SOITEC's Motion For Partial Summary Judgment For Invalidity of Asserted Claims of United States Patent No. 5,834,812 in View of Prior Art filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment That the Best Mode Requirement is Satisfied for the Claims of the '009 and '396 Patents filed by SOITEC Silicon On Insulator Technologies SA.Answering Brief/Response due date per Local Rules is Jul. 19, 2010. (Attachments: # 1 Certificate of Service)(Reed, John) (Entered: Jul. 2, 2010).
Redacted Version of 200 Opening Brief in Support, by MEMC Electronic Materials Inc.. (Attachments: # 1 Certificate of Service)(Rogowski, Patricia) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).
Redacted Version of 190 Appendix by MEMC Electronic Materials Inc.. (Attachments: #1 Appendix MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).
Redacted Version of 198 Opening Brief in Support,, SOITEC/CEA Parties' Opening Brief In Support Of Motion For Summary Judgment: Non-Infringement by Commissariat a LEnergie Atomique, SOITEC Silicon On Insulator Technologies SA, SOITEC U.S.A., Inc.. (Kraft, Denise) (Entered: Jul. 8, 2010).
Redacted Version of 197 Sealed Motion for Summary Judgment SOITEC/CEA Parties' Motion For Summary Judgment: Non-In-

(56) References Cited

OTHER PUBLICATIONS fringement (Filed Under Seal)Sealed Motion for Summary Judgment SOITEC/CEA Parties' Motion For Summary Judgment: Non-Infringement (Filed Under Seal) SOITEC/CEA Parties' Motion For Summary Judgment: Non-Infringement by Commissariat a LEnergie Atomique, SOITEC Silicon On Insulator Technologies SA, SOITEC U.S.A., Inc.. (Kraft, Denise) (Entered: Jul. 8, 2010).
Redacted Version of 192 Appendix, Plaintiffs' Omnibus Appendix to Daubert Motion And Motions For Partial Summary Judgment Filed on Jul. 2, 2010—vol. VI of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 193 Appendix, Plaintiffs' Omnibus Appendix to Daubert Motion And Motions For Partial Summary Judgment Filed on Jul. 2, 2010—vol. VIII of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 194 Appendix, Plaintiffs' Omnibus Appendix to Daubert Motion And Motions For Partial Summary Judgment Filed on Jul. 2, 2010—vol. X of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 195 Appendix, Plaintiffs' Omnibus Appendix to Daubert Motion And Motions For Partial Summary Judgment Filed on Jul. 2, 2010—vol. XVII of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 196 Appendix, Plaintiffs' Omnibus Appendix to Daubert Motion And Motions For Partial Summary Judgment Filed on Jul. 2, 2010—vol. XIX of XIX by Commissariat a LEnergie Atomique, SOITEC Silicon On Insulator Technologies SA, SOITEC U.S.A., Inc.. (Kraft, Denise) (Entered: Jul. 9, 2010).
Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).
Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).
Claim Construction Answering Brief re 168 Claim Construction Opening Brief, 228 Claim Construction Answering Brief Plaintiffs S.O.I.TEC On Insulator Technologies, S.A. And Commissariat A Energie Atomique's Answering Claim Construction Brief filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 9, 2010).
Appendix re 230 Claim Construction Answering Brief, Appendix to Plaintiffs S.O.I.TEC On Insulator Technologies, S.A. And Commissariat A Energie Atomique's Answering Claim Construction Brief by Commissariat a LEnergie Atomique, SOITEC Silicon On Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).
Redacted Version of 183 Appendix, Joint Appendix of Exhibits to Opening and Answering Claim Construction Briefs vol. IV of VI by Commissariat a LEnergie Atomique, SOITEC Silicon On Insulator Technologies SA. (Kraft, Denise) (Entered: Jul. 12, 2010).
Redacted Version of 170 Exhibit to a Document, Exhibit A to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Kraft, Denise) (Entered: Jul. 12, 2010).
Redacted Version of 171 Exhibit to a Document, Exhibit B to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Kraft, Denise) (Entered: Jul. 12, 2010).
Redacted Version of 172 Exhibit to a Document, Exhibit C to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Kraft, Denise) (Entered: Jul. 12, 2010).
Answering Brief in Opposition re 186 Motion in Limine SOITEC/CEA Parties' Motion to Exclude The Expert Report of Dr. Pascal Bellon and Any Related Testimony filed by MEMC Electronic Materials Inc..Reply Brief due date per Local Rules is Jul. 29, 2010. (Rogowski, Patricia) (Entered: Jul. 19, 2010).
Answering Brief in Opposition re 208 Motion for Partial Summary Judgment Plaintiffs' Motion For Partial Summary Judgment That The Bruel Patent Does Not Anticipate The Aspar Patents filed by MEMC Electronic Materials Inc..Reply Brief due date per Local Rules is Jul. 29, 2010. (Rogowski, Patricia) (Entered: Jul. 19, 2010).
Answering Brief in Opposition re 202 Motion for Partial Summary Judgment SOITEC/CEA Parties Motion For Partial Summary Judgment That The Patents in Suit Satisfy The Written Description Requirement filed by MEMC Electronic Materials Inc..Reply Brief due date per Local Rules is Jul. 29, 2010. (Rogowski, Patricia) (Entered: Jul. 19, 2010).
Answering Brief in Opposition re 204 Motion for Partial Summary Judgment Plaintiffs' Motion For Partial Summary Judgment That The Certificate of Correction For the '396 Patent is Valid filed by MEMC Electronic Materials Inc..Reply Brief due date per Local Rules in Jul. 29, 2010. (Rogowski, Patricia) (Entered: Jul. 19, 2010).
Answering Brief in Opposition re 210 Motion for Partial Summary Judgment SOITEC's Motion For Partial Summary Judgment of Invalidity of United States Patent No. 5,834,812 For Lack of Enablement filed by MEMC Electronic Materials Inc..Reply Brief due date per Local Rules is Jul. 29, 2010. (Rogowski, Patricia) (Entered: Jul. 19, 2010).
Answering Brief in Opposition re 212 Motion for Partial Summary Judgment SOITEC's Motion For Partial Summary Judgment For Invalidity of Asserted Claims of United States Patent No. 5,834,812 in View of Prior Art filed by MEMC Electronic Materials Inc..Reply Brief due date per Local Rules in Jul. 29, 2010. (Rogowski, Patricia) (Entered: Jul. 19, 2010).
Appendix re 247 Answering Brief in Opposition,, Appendix To Plaintiffs' Answering Brief In Opposition To Defendant's Motion For Partial Summary Judgment Of Invalidity Of The Asserted Aspar Claims (PA-1103-PA-1156) by Commissariat a LEnergie Atomique, SOITEC Silicon On Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).
Appendix re 250 Answering Brief in Opposition, Appendix to Plaintiffs' Answering Brief in Opposition to Defendant's Motion For Summary Judgment of Non-Infringement by Commissariat a LEnergie Atomique, SOITEC Silicon On Insulator Technologies SA. (Attachments: # 1 Exhibit PA-1190-PA-1191, # 2 Certificate of Service)(Kraft, Denise) (Entered: Jul. 19, 2010).
Redacted Version of 241 Answering Brief in Opposition, to Plaintiffs' Motion for Partial Summary Judgment that the Best Mode Requirement is Satisfied for the Claims of the '009 and '396 Patents by MEMC Electronic Materials Inc.. (Rogowski, Patricia) (Entered: Jul. 26, 2010).
Redacted Version of 249 Answering Brief in Opposition, to Plaintiffs' Motion for Summary Judgment on the Infringement of U.S. Patent No. 5,834,812 by MEMC Electronic Materials Inc.. (Rogowski, Patricia) (Entered: Jul. 26, 2010).
Redacted Version of 253 Answering Brief in Opposition, to Plaintiffs' Motion for Partial Summary Judgment that the Aspar Patents Are Not Invalid for Inequitable Conduct by MEMC Electronic Materials Inc.. (Rogowski, Patricia) (Entered: Jul. 26, 2010).
Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appen-

(56) References Cited

OTHER PUBLICATIONS dix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).
Redacted Version of 261 Answering Brief in Opposition, to Plaintiffs' Motion for Partial Summary Judgment that the Best Mode Requirement is Satisfied for the Claims of the '009 and '396 Patents (Corrected Version of D.I. 241) by MEMC Electronic Materials Inc.. (Rogowski, Patricia) (Entered: Jul. 26, 2010).
Redacted Version of 250 Answering Brief in Opposition, to Soitec's Brief in Opposition to Defendant's Motion For Summary Judgment of Non-Infringement by Commissariat a LEnergie Atomique, SOITEC Silicon On Insulator Technologies SA. (Attachments: # 1 Certificate of Service)(Kraft, Denise) (Entered: Jul. 26, 2010).
Redacted Version of 247 Answering Brief in Opposition,, to Plaintiffs' Answering Brief In Opposition To Defendant's Motion For Partial Summary Judgment Of In validity Of The Asserted Aspar Claims by Commissariat a LEnergie Atomique, SOITEC Silicon On Insulator Technologies SA. (Attachments: # 1 Certificate of Service)(Kraft, Denise) (Entered: Jul. 26, 2010).
Redacted Version of 254 Appendix,, to Appendix To Plaintiffs' Answering Brief In Opposition To Defendant's Motion For Partial Summary Judgment Of Invalidity Of The Asserted Aspar Claims (PA-1103-PA-1143 by Commissariat a LEnergie Atomique, SOITEC Silicon On Insulator Technologies SA. (Kraft, Denise) (Entered: Jul. 26, 2010).
Redacted Version of 251 Appendix,, to Appendix to Plaintiffs' Answering Brief in Opposition to Defendant's Motion For Summary Judgment of Non-Infringement by Commissariat a LEnergie Atomique, SOITEC Silicon On Insulator Technologies SA. (Kraft, Denise) (Entered: Jul. 26, 2010).
Reply Brief re 204 Motion for Partial Summary Judgment Plaintiffs' Motion For Partial Summary Judgment That The Certificate of Correction For the '396 Patent is Valid Reply Brief in Support of Plaintiffs' Motion For Partial Summary Judgment That The Certificate of Correction For the '396 Patent is Valid filed by Commissariat a LEnergie Atomique, SOITEC Silicon On Insulator Technologies SA. (Attachments: # 1 Certificate of Service)(Kraft, Denise) (Entered: Jul. 30, 2010).
Declaration re 268 Reply Brief, Declaration of Marcus T. Hall in Support of Reply Brief in Support of Plaintiffs' Motion For Partial Summary Judgment That The Certificate of Correction For the '396 Patent is Valid by Commissariat a LEnergie Atomique, SOITEC Silicon On Insulator Technologies SA. (Attachments: # 1 Exhibit A, # 2 Certificate of Service)(Kraft, Denise) (Entered: Jul. 30, 2010).
Appendix re 268 Reply Brief, Omnibus Appendix to Plaintiffs' Reply Briefs in Support of Plaintiffs' Daubert Motion and Motions For Partial Summary Judgment (PA-1192-PA-1261) by Commissariat a LEnergie Atomique, SOITEC Silicon On Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Reply Brief re 210 Motion for Partial Summary Judgment SOITEC's Motion For Partial Summary Judgment of Invalidity of United States Patent No. 5,834,812 For Lack of Enablement Reply Brief in Support of SOITEC's Motion For Partial Summary Judgment of Invalidity of United States Patent No. 5,834,812 For Lack of Enablement filed by SOITEC Silicon On Insulator Technologies SA, SOITEC U.S.A., Inc.. (Attachments: # 1 Certificate of Service)(Kraft, Denise) (Entered: Jul. 30, 2010).

Reply Brief re 212 Motion for Partial Summary Judgment SOITEC's Motion For Partial Summary Judgment For Invalidity of Asserted Claims of United States Patent No. 5,834,812 in View of Prior Art Reply Brief in Support of SOITEC's Motion For Partial Summary Judgment For Invalidity of Asserted Claims of United States Patent No. 5,834,812 in View of Prior Art filed by SOITEC Silicon On Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Brief re 202 Motion for Partial Summary Judgment SOITEC/CEA Parties Motion For Partial Summary Judgment That The Patents in Suit Satisfy The Written Description Requirement Reply Brief in Support of SOITEC/CEA Parties' Motion For Partial Summary Judgment That The Patents in Suit Satisfy The Written Description Requirement filed by Commissariat a LEnergie Atomique, SOITEC Silicon On Insulator Technologies SA. (Attachments: # 1 Certificate of Service)(Kraft, Denise) (Entered: Jul. 30, 2010).
Redacted Version of 269 Appendix, to Reply Brief in Support of MEMC's Motion for Partial Summary Judgment of Invalidity of the Asserted Aspar Patent Claims by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
Redacted Version of 273 Appendix Reply Brief in Support of MEMC's Motion for Summary Judgment of Non-Infringement by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).
Redacted Version of 267 Reply Brief in Support of MEMC's Motion for Partial Summary Judgment of Invalidity of the Asserted Aspar Patent Claims by MEMC Electronic Materials Inc.. (Rogowski, Patricia) (Entered: Aug. 3, 2010).
Redacted Version of 271 Reply Brief in Support of MEMC's Motion for Summary Judgment of Non-Infringement by MEMC Electronic Materials Inc.. (Rogowski, Patricia) (Entered: Aug. 3, 2010).
Redacted Version of 274 Appendix,, Omnibus Appendix to Plaintiffs' Reply Briefs in Support of Plaintiffs' Daubert Motion and Motions For Partial Summary Judgment (PA-1192-PA-1198 and PA-1207-PA-1230 Filed Under Seal) by Commissariat a LEnergie Atomique, SOITEC Silicon On Insulator Technologies SA. (Kraft, Denise) (Entered: Aug. 6, 2010).
Redacted Version of 277 Reply Brief, in Support of SOITEC/CEA Parties' Motion to Exclude The Expert Report of Dr. Pascal Bellon and Any Related Testimony by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion For Summary Judgment: Non-Infringement (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 279 Reply Brief,, in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 281 Reply Brief, in Support of Plaintiffs' Motion For Partial Summary Judgment That The Bruel Patent Does Not Anticipate The Aspar Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion For Partial Summary Judgment That The Aspar Patents Are Not Invalid For Inequitable Conduct (Filed Under Seal)

(56) References Cited

OTHER PUBLICATIONS by Commissariat a LEnergie Atomique, SOITEC Silicon On Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001-FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon On Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon On Insulator Technologies SA. (Attachments: # 1 Certificate of Service)(Kraft, Denise) (Entered: Sep. 24, 2010).
Redacted Version of 303 Exhibit to a Document Exhibit A to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon On Insulator Technologies SA, SOITEC U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon On Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon On Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon On Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon On Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).
Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon On Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon On Insulator Technologies SA, SOITEC U.S.A., Inc.. (Kraft, Denise) (Entered: Oct. 21, 2010).
Letter to The Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered:

(56) References Cited

OTHER PUBLICATIONS

Oct. 22, 2010) So Ordered, re 333 Stipulation filed by SOITEC Silicon On Insulator Technologies SA, SOITEC U.S.A., Inc., Commissariat a LEnergie Atomique, 332 Stipulation, filed by SOITEC Silicon On Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff's Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC's Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion For Judgment as a Matter of Law of No Unenforceability of the '009 Patent Due To Inequitable Conduct submitted at trial by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. and against plaintiffs S.O.I.TEC Silicon On Insulator Technologies, S.A. and Commisseriat A LEnergie Atomique et aux Energies Alternatives as to the 812 patent. It Is Further Ordered that judgment be and is hereby entered in favor of plaintiffs S.O.I.TEC Silicon On Insulator Technologies, S.A. and Commisseriat A LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Materials Inc., SOITEC Silicon On Insulator Technologies SA. (Rogowski, Patricia) (Entered: Nov. 15, 2010).
Motion for Reargument re 348 Judgment,, (MEMCS Motion for Reargument of the Courts Order Re: the Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiff's Motion for Reargument—filed by Commissariat a LEnergie Atomique, SOITEC Silicon On Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon On Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon On Insulator Technologies SA, SOITEC U.S.A., Inc.. (Kraft, Denise) (Entered: Dec. 3, 2010).
Reply Brief re 350 Motion for Reargument re 348 Judgment,, (MEMCS Motion for Reargument of the Courts Order Re: the Unenforceability of the 009 Patent) Plaintiffs' Opposition to MEMC's Motion For Reargument of the Court's Order Re: The Unenforceability of the '009 Patent filed by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion For Reargument of the Court's Order Re: The Unenforceability of the '009 Patent by Commissariat a LEnergie Atomique, SOITEC Silicon On Insulator Technologies SA, SOITEC U.S.A., Inc.. (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon On Insulator Technologies SA, SOITEC U.S.A., Inc.. (Kraft, Denise) (Entered: Dec. 13, 2010).
Motion for Judgment as a Matter of Law—MEMC's Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).
Motion for Judgment as a Matter of Law Plaintiffs' Renewed Motion For Judgment As A Matter of Law Or In The Alternative For A New Trial—filed by Commissariat a LEnergie Atomique, SOITEC Silicon On Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion For Judgment As A Matter of Law Or In The Alternative For A New Trial filed by Commissariat a LEnergie Atomique, SOITEC Silicon On Insulator Technologies

(56) References Cited

OTHER PUBLICATIONS

SA.Answering Brief/Response due date per Local Rules is Jan. 3, 2011. (Attachments: # 1 Certificate of Service)(Kraft, Denise) (Entered: Dec. 14, 2010).
Motion For Injunctive Relief Plaintiffs' Motion For Injunctive Relief And To Lift Stay on Damages Discovery—filed by Commissariat a LEnergie Atomique, SOITEC Silicon On Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).
Stipulation to Extend Time Post-Trial Answering Briefs to Jan. 12, 2011—filed by MEMC Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon On Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 Motion for Judgment as a Matter of Law—MEMC's Renewed Motion for Judgment as a Matter of Law or in the Alternative for a New Trial filed by Commissariat a LEnergie Atomique, SOITEC Silicon On Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition re 361 Motion for Judgment as a Matter of Law Plaintiffs' Renewed Motion For Judgment As A Matter of Law Or In The Alternative For A New Trial (MEMCS Answering Brief in Opposition to Plaintiffs Renewed Motion for Judgment as a Matter of Law or in the Alternative for a New Trial) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (Declaration of Robert M. Evans, Jr. in Support of MEMCS Opposition to Plaintiffs Renewed Motion for Judgment as a Matter of Law or in the Alternative for a New Trial) by MEMC Electronic Materials Inc.. (Attachments: # 1 Exhibit 1, # 2 Exhibit 2, # 3 Certificate of Service)(Rogowski, Patricia) (Entered: Jan. 14, 2011).
Redacted Version of 376 Answering Brief in Opposition, to Plaintiffs' Motion for Injunctive Relief and to Lift Stay on Damages Discovery by MEMC Electronic Materials Inc.. (Attachments: # 1 Certificate of Service)(Rogowski, Patricia) (Entered: Jan. 20, 2011).
Redacted Version of 377 Appendix to MEMC's Answering Brief in Opposition to Plaintiffs' Motion for Injunctive Relief and to Lift Stay on Damages Discovery by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Service)(Rogowski, Patricia) (Entered: Jan. 20, 2011).
Joint Stipulation to Extend Time of Post-Trial Reply Briefs to Tuesday, Feb. 1, 2011—filed by Commissariat a LEnergie Atomique, SOITEC Silicon On Insulator Technologies SA, SOITEC U.S.A., Inc.. (Kraft, Denise) (Entered: Jan. 28, 2011).
Joint Stipulation to Extend Time of Post-Trial Reply Briefs to Friday, Feb. 4, 2011—filed by Commissariat a LEnergie Atomique, SOITEC Silicon On Insulator Technologies SA, SOITEC U.S.A., Inc.. (Kraft, Denise) (Entered: Jan. 31, 2011).
Redacted Version of 364 Opening Brief in Support,,,, Redacted Version of Opening Brief in Support of Plaintiffs' Motion For Injunctive Relief And To Lift Stay on Damages Discovery by Commissariat a LEnergie Atomique, SOITEC Silicon On Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit O, # 16 Exhibit P, # 17 Exhibit Q, # 18 Exhibit R, # 19 Exhibit S)(Kraft, Denise) (Entered: Feb. 2, 2011).
Reply Brief re 359 Motion for Judgment as a Matter of Law—MEMC's Renewed Motion for Judgment as a Matter of Law or in the Alternative for a New Trial filed by MEMC Electronic Materials Inc.. (Attachments: # 1 Certificate of Service)(Rogowski, Patricia) (Entered: Feb. 4, 2011).
Reply Brief re 361 Motion for Judgment as a Matter of Law Plaintiffs' Renewed Motion For Judgment As A Matter of Law Or In The Alternative For A New Trial filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 4, 2011).
Declaration re 387 Reply Brief, Declaration of Michael L. Brody in Support of Reply Brief In Support of Plaintiffs' Renewed Motion For Judgment as a Matter of Law or In The Alternative For a New Trial by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 4, 2011).
Motion to Strike 386 Reply Brief, Motion By Plaintiffs' To Strike Reply Brief In Support of MEMC's Renewed Motion For Judgment as a Matter of Law or, In The Alternative, a New Trial (D.I. 386)—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 8, 2011).
Opening Brief in Support re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).
Declaration re 391 Opening Brief in Support,, Declaration of Marcus T. Hall in Support of Plaintiffs' Opening Brief in Support of Motion to Strike Reply Brief In Support of MEMC's Renewed Motion For Judgment as a Matter of Law or, In The Alternative, a New Trial (D.I. 386) by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 8, 2011).
Redacted Version of 389 Reply Brief, Redacted Version of Reply Brief in Support of Plaintiffs' Motion For Injunctive Relief And To Lift Stay on Damages Discovery by Commissariat a LEnergie Atomique, SOITEC Silicon On Insulator Technologies SA, SOITEC U.S.A., Inc.. (Kraft, Denise) (Entered: Feb. 9, 2011).
Answering Brief in Opposition re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) filed by MEMC Electronic Materials Inc..Reply Brief due date per Local Rules is Feb. 28, 2011. (Attachments: # 1 Exhibit 1-3, # 2 Certificate of Service)(Rogowski, Patricia) (Entered: Feb. 18, 2011).
Reply Brief re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By

(56) References Cited

OTHER PUBLICATIONS

Plaintiffs' To Strike Reply Brief In Support of MEMC's Renewed Motion For Judgment as a Matter of Law or, In The Alternative, a New Trial (D.I. 386) filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 28, 2011).

Non-Final Office Action—U.S. Appl. No. 12/063,808—dated Apr. 6, 2010—Deguet et al., (8-pgs).

Caymax, et al., "High-Mobility Group IV Materials and Devices"—Materials Research Society, Symposium Proceedings vol. 809, Apr. 13-15, 2004, San Francisco, CA.

PCT Request in French (5-pgs).

PCT International Search Report—Int'l Apln. No. PCT/FR2006/001945 in English (3 pgs).

PCT International Preliminary Report on Patentability for Int'l Apln. No. PCT/FR2006/001945 in English (5 pgs).

PCT Written Opinion for Int'l Apln. No. PCT/FR2006/000297 in English (3 pgs).

\* cited by examiner

METHOD FOR MAKING A THIN-FILM ELEMENT

PRIORITY CLAIM

This application is a U.S. nationalization of PCT Application No. PCT/FR2006/002184, filed Sep. 25, 2006, and claims priority to French Patent Application No. 0509897, filed Sep. 28, 2005.

TECHNICAL FIELD

The invention concerns a method for making a thin-film element.

BACKGROUND

In such methods, a support is frequently used as a donor structure: a portion of the donor structure (generally a superficial layer) is used as an element of the target structure, for example by means of a layer transfer.

This solution is encountered in particular for making a germanium on insulator (GeOI) type structure, for example as described in the papers "Germanium-On-Insulator (GeOI) structure realized by the Smart Cut™ Technology", by F. Letertre et al. in Mat. Res. Soc. Symp. Proc. Vol. 809, 2004 Materials Research Society, and "200 mm Germanium-On-Insulator (GeoI) Structures realized from epitaxial wafers using the Smart Cutt™ technology", by C. Deguet et al., ECS 2005, Quebec, vol. 2005-05, page 78.

Those papers propose two alternative solutions for transferring the thin germanium layer that forms the superficial layer of the GeOI structure: the donor wafer used is either a bulk germanium wafer or a silicon wafer on which a germanium layer has been epitaxially deposited, at least a portion whereof will be transferred.

The solution using bulk germanium is advantageous from the electrical point of view in particular because of the very high crystalline quality of the transferred material (the proportion of dislocations in the bulk germanium is close to zero), but the manipulation of bulk germanium is relatively complex, in particular because of the high density of this material and its mechanical weakness.

This is why at present it is envisaged instead to use in practice as the donor wafer the germanium-based structure deposited epitaxially on silicon already mentioned.

However, using this solution as proposed in the papers already cited sometimes produces layers of germanium having a proportion of dislocations of the order of a few $10^6$ cm$^{-2}$, essentially generated during the phase of epitaxial deposition of the germanium on the silicon because of the lattice parameter difference between the crystalline arrays of these two materials ($\Delta$=4.2%).

Generally speaking, it can be beneficial to use as the donor wafer a structure consisting of a first material deposited epitaxially on a second material (for example to benefit from the electrical properties, or more generally the physical properties, of the one and the mechanical properties of the other). If these two materials have different lattice parameters, this type of solution leads, however, unless particular precautions are observed, to a relatively high proportion of dislocations in the layer of the first material, which can degrade the electrical and/or physical properties of that layer.

SUMMARY

In order to improve upon this state of affairs, and in particular to propose a method of making a thin-film element that can combine ease of manipulation of the donor wafer and a low proportion of dislocations in the layer donated thereby, the invention proposes a method for making a thin-film element characterized by the following steps:

epitaxial growth of a crystalline layer of a first material on a crystalline layer of a support formed in a second material different from the first material, said layer of the first material having a thickness such that its lattice parameter is determined by (and therefore generally corresponds to) that of the crystalline layer of the support;

formation of a dielectric layer on the side of said layer of the first material opposite the support to form a donor structure;

assembly of the donor structure with a receiver wafer;

elimination of the support.

Very few dislocations are produced in the layer of the first material by this method. The two materials can therefore be chosen independently for their respective properties, without this choice compromising the crystalline quality of the epitaxially deposited layer.

In one possible embodiment, there is effected, prior to the formation of the dielectric layer, a step of epitaxial growth of a layer of third material on said layer of the first material, the material and the thickness of the layer of third material being chosen so that the lattice parameter of the third material is determined by that of the crystalline layer of the support.

The layer of the first material is therefore encapsulated, and thus protected, between the layers of the second and third materials. Moreover, the layers are of good quality since the lattice parameter is uniform in this portion of the structure.

The third material is silicon, for example.

In this case the following steps can follow the step of elimination of the support:

local etching of the crystalline layer of the first material as far as the layer of the third material;

epitaxial growth of the third material on the regions of the layer of the third material exposed by the etching.

Regions of the first material and regions of the third material are therefore obtained on the surface, all of good crystalline quality. Each region can therefore be used with a specific aim according to its own properties.

The step of formation of the dielectric layer can comprise a step of at least partial oxidation of the epitaxially grown layer of the third material in order to obtain said dielectric layer.

This solution is particularly practical and generates an oxide layer of particularly good quality. It also underlines the benefit of the step of epitaxial growth of the layer of the third material referred to hereinabove.

Alternatively, the step of formation of the dielectric layer of the structure comprises a step of depositing a dielectric layer.

The dielectric layer is an oxide layer, for example.

In one embodiment, the support is a plate of the second material.

In another embodiment, the support is of the superficial layer on insulator type, the superficial layer whereof forms the crystalline layer of the second material.

The first material is germanium, for example. This particular case is beneficial because of the physical properties (in particular the electrical transport properties) of germanium and the problems of manipulating it.

The second material is bulk silicon, for example, which is relatively widely used and which can therefore be manipulated using standard means.

In one variant that can be envisaged, the second material is strained silicon or SiGe, which has in particular the effect of increasing the critical thickness of germanium.

In all cases, there may be envisaged a step of epitaxial growth of the first material on the face of the crystalline layer of the first material left free by eliminating the support.

Overall, the layer of first material finally obtained will be of better quality than a layer of first material of the same thickness deposited directly on the second material support.

Other features and advantages of the invention will become apparent on reading the following description with reference to the appended drawings, in which:

The thicknesses of the layers represented in the Figures are purely illustrative and must not be understood as proportional to the thickness of the layers in reality.

DETAILED DESCRIPTION

A first embodiment of the invention is described next with reference to FIGS. 1 to 7.

Figure 1:
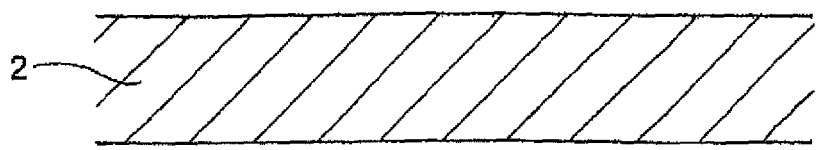
FIGS. 1 to 7 represent the principal steps of a first example of a method for making a thin-film element according to the teachings of the invention.

This embodiment uses a plate 2 of crystalline silicon, as shown diagrammatically in FIG. 1. This is therefore perfectly relaxed silicon. Alternatively, it is possible to use a wafer having on the surface a silicon layer, for example an SOI (silicon on insulator) wafer. Such a structure comprises a bulk wafer (generally of silicon), a buried oxide (BOX) layer and a superficial silicon layer. Another variant can use a silicon wafer having a buried weak area obtained, for example, by implantation of gaseous species (for example hydrogen) favoring subsequent elimination of the wafer and its re-use.

A germanium layer 4 with a thickness less than the critical thickness is grown epitaxially on this silicon plate 2. The critical thickness is the thickness up to which the crystalline quality of the epitaxially grown layer is guaranteed: above that thickness, defects appear in the epitaxially grown layer, especially dislocations. Below this critical thickness, the crystalline structure of the germanium layer 4 (and in particular the lattice parameter) is imposed by the superficial crystalline structure of the plate 2: the lattice parameter of the germanium layer 4 is equal to that of the superficial crystalline structure of the plate 2 of silicon. The critical thickness depends of course on the wafer on which the epitaxial growth is effected. On the subject of the critical thickness, see the paper "Calculation of critical layer thickness considering thermal strain in $Si_{1-x}Ge_x$/Si strained-layer hetero-structures", by J. Huang et al. in J. Appl. Phys 83 (1), 1998 American Institute of Physics.

There is grown in the example described here, for a bulk silicon plate, a germanium layer 4 with a thickness less than 3 nm. This produces the stack represented in FIG. 2.

Because the thickness of the germanium layer 4 is less than the critical thickness and because its crystalline structure is imposed by that of the plate 2, which is incidentally of good crystalline quality, the proportion of dislocations in the germanium layer is practically zero.

Figure 3:
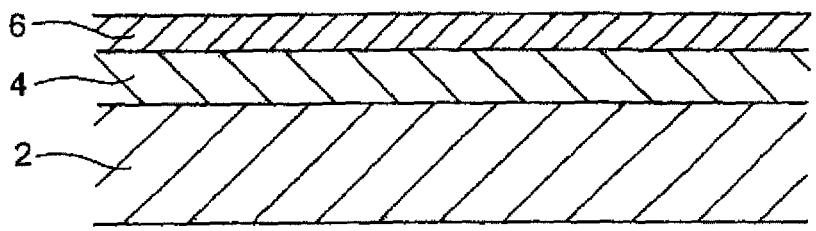

In the embodiment proposed here, there is then deposited (also epitaxially, for example) a very thin silicon layer 6, typically with a thickness less than 1 nm, typically a few angstrom units. The structure represented in FIG. 3 is then obtained.

Alternatively, it is possible to deposit epitaxially a slightly thicker silicon layer (typically between 1 nm and 20 nm thick, for example between 2 nm and 3 nm thick) and to oxidize all or part of that layer by chemical or physical surface treatment. A few Ångström units of silicon could remain after treatment, for example, advantageously 1 or 2 silicon monolayers.

Because of the crystalline quality of the silicon of the plate 2 and of the epitaxially deposited germanium, the silicon layer epitaxially deposited on the germanium will also have good crystalline quality and the interface between this silicon layer and the germanium layer will be of good quality, in particular from an electrical point of view.

Note that the lattice parameter of the germanium in the layer being determined by that of the silicon of the layer, it will also be that of the silicon layer produced and so dislocations will be avoided whatever its thickness. Note that, in the structure, the germanium layer 4 is encapsulated between the silicon plate 2 and the thin layer 6, which provides good protection of the germanium layer in the subsequent steps of the method now being described.

After appropriate cleaning, a dielectric, for example $Si_3N_4$, a material of high permittivity (such as AlN or $HfO_2$), an oxide (such as $Al_2O_3$ or $SiO_2$), is deposited on the thin layer 6. In this example, the choice is made to deposit $SiO_2$, for example by a PECVD (Plasma Enhanced Chemical Vapor Deposition) type process, here at a temperature of the order of 380° C., in order to obtain a thickness of 10 nm to 300 nm of oxide, densified or not.

Alternatively, it is possible to deposit this oxide layer directly on the germanium layer without making use of the epitaxially deposited silicon layer. In this case, the $Ge/SiO_2$ interface will be of lesser electrical quality, but may suffice for certain applications.

The oxide layer 8 deposited in this way is intended to form the buried oxide (BOX) layer of the GeOI structure finally obtained.

Figure 4:
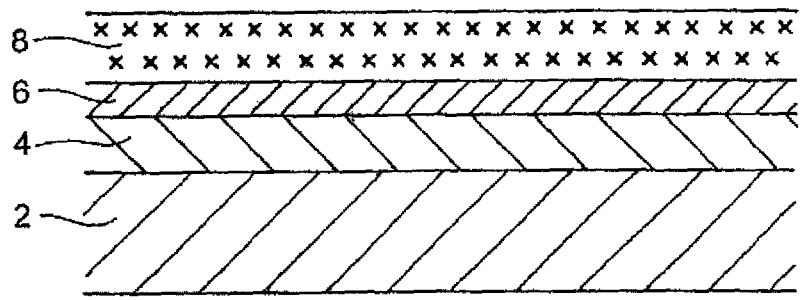

The stack obtained after deposition of the oxide layer 8, represented diagrammatically in FIG. 4, is then transferred to a receiver wafer 10, for example another silicon plate oxidized on the surface or not. Here this transfer is effected by molecular bonding of the oxide layer 8 to the receiver wafer 10, after activation of the faces to be bonded (for example by chemical activation and/or mechanical and/or chemical polishing (CMP) and/or plasma).

Figure 5:
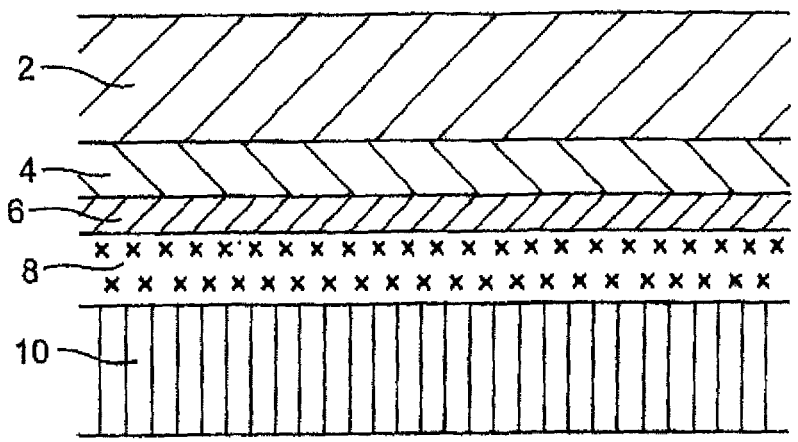

The structure represented in FIG. 5 is then obtained, which comprises the following stack:
 the receiver wafer 10;
 the oxide layer 8;
 the thin silicon layer 6 (optional but advantageous);
 the germanium layer 4 (the thickness of which is less than the critical thickness);
 the silicon plate 2.

There follows the elimination of the plate 2, for example by mechanical action (lapping and polishing) and/or chemical etching of the silicon selectively relative to the germanium (for example using TMAH (tetramethylammonium hydroxide)).

The advantage of the above variant using an SOI wafer rather than the solid plate 2 of silicon as the starting wafer lies in easier elimination. With an SOI wafer, there are fewer precautions to observe: the silicon wafer is eliminated first by mechanical action to reach the buried oxide layer. This can then be removed, for example by selective chemical etching relative to the silicon. The thin silicon layer is then removed, for example by selective chemical etching relative to the germanium.

In the case of the variant proposed hereinabove and providing a buried weak zone, there follows fracture at the level of this buried weak zone, by thermal and/or mechanical treatment, for example. The residual layer of the silicon wafer that remains attached to the germanium layer after fracture can then be selectively eliminated, for example by chemical etching as in the previous case.

Figure 6:
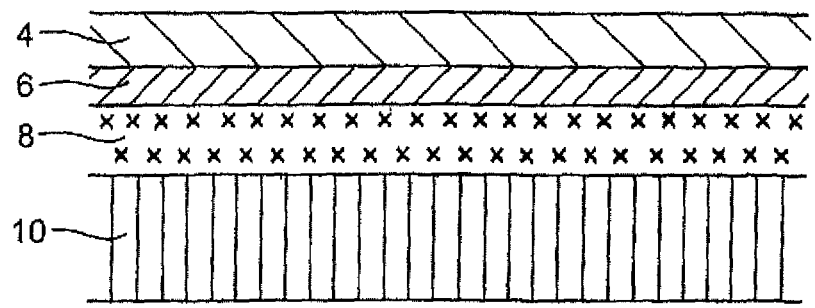

The required GeOI structure is then obtained, as represented in FIG. 6:
the wafer 10,
the buried oxide layer 8,
the thin silicon layer 6 (optional),
the germanium layer 4, at this stage superficial.

Because of its thickness less than the critical thickness during epitaxial growth, the germanium layer 4 will include very few dislocations, as already mentioned. The electrical properties of this germanium layer 4 therefore conform to those expected from the use of germanium, with a quality equivalent to that which would have been obtained using a bulk germanium wafer.

The presence of a thin silicon layer 6, typically less than 1 nanometer thick, between the germanium layer 4 and the buried oxide 8 does not call into question these good electrical properties (it even improves them), and provides a good quality interface with the germanium.

The GeOI structure can therefore be used as it stands in an electronic component.

It is equally possible, if it is required to use a GeOI structure with a thicker germanium layer, to proceed to further epitaxial growth of germanium on the germanium layer 4 of the above GeOI structure. To preserve the crystalline quality of the germanium layer, it will be necessary to ensure that the thickness of the epitaxially grown germanium remains less than the critical thickness for the new wafer now considered and formed of the Si/SiO$_2$/Si (optional)/Ge (strained) stack. Moreover, if the constraints at the level of the crystalline quality of the germanium layer are relaxed, a greater thickness could be obtained epitaxially.

The proportion of dislocations obtained will in all cases be less than the proportion of dislocations that would have been obtained by growing the total thickness of germanium finally used directly on a bulk silicon plate 2.

Figure 7:
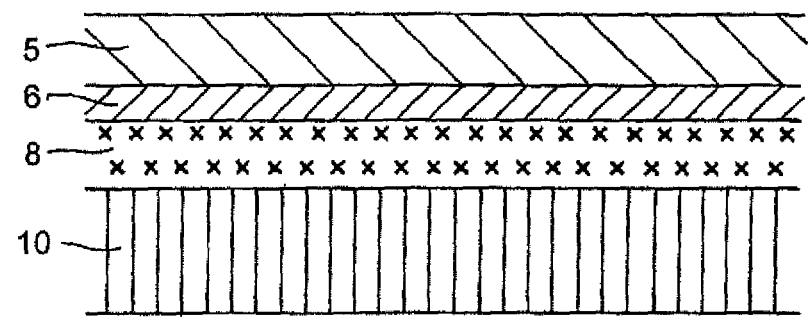

Given these hypotheses, there is obtained the structure represented in FIG. 7, which differs from that of FIG. 6 by the greater thickness of the germanium layer 5.

Figure 8:
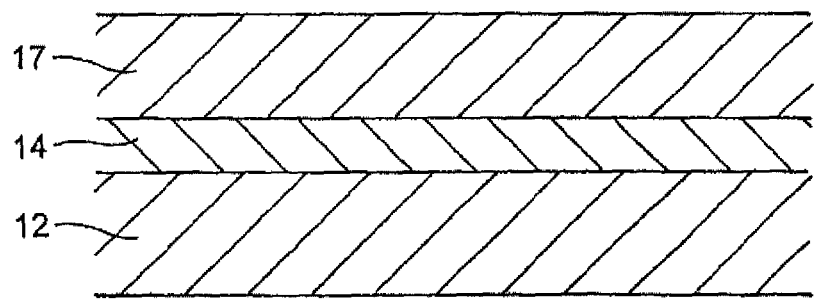
FIGS. 8 and 9 represent two steps of a method of making a thin-film element according to a second embodiment of the invention.

A second embodiment of the invention is described next with reference to FIGS. 8 and 9.

The second embodiment is close to the first embodiment that has just been described, and its description is essentially limited to the steps that distinguish it from the first embodiment.

Figure 2:
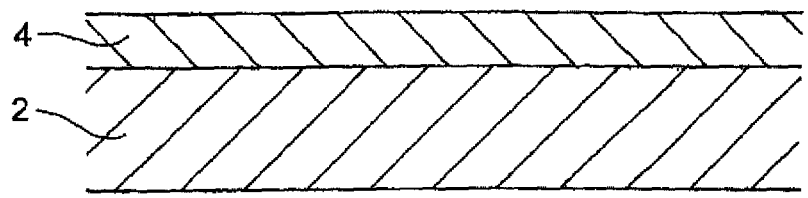

This second embodiment also uses a silicon plate 12 (or an SOI wafer) on which is epitaxially grown a germanium layer 14 of thickness less than the critical thickness, as described with reference to FIG. 2.

In the second embodiment described here, there is epitaxially grown on the germanium layer 4 a silicon layer with a thickness of the order of a few nanometers, for example 5 nm (and generally speaking less than 10 nm).

There is obtained in this way a structure with a superficial silicon layer 17 having a relatively large thickness compared to that of the thin structure 6 of the first embodiment.

Figure 9:
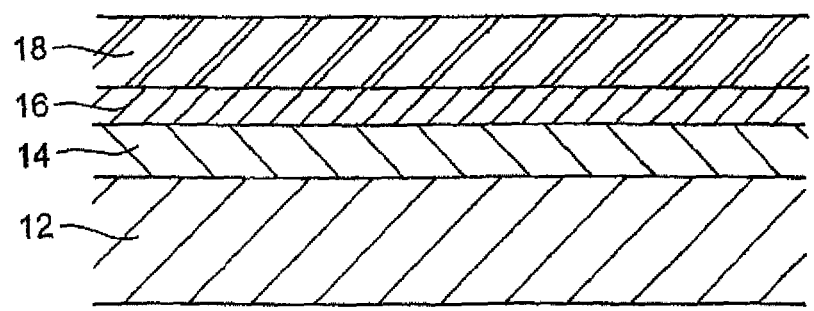

This is followed by the oxidation of all or part of the superficial silicon layer 17, for example by plasma or chemical treatment, or by thermal oxidation (of course at temperatures where there is no risk of degrading the underlying germanium layer 14), in order to obtain at the surface a thermal oxide layer 18 that will form the buried oxide in the final GeOI structure, as represented in FIG. 9.

As can be seen in that FIG., it is proposed here to stop oxidation advantageously a few Ångström units before the interface between the germanium layer 14 and the silicon layer 17 in order to leave a thin silicon layer 16 between the germanium layer 14 and the oxide layer 18 for electrical reasons (the SiO$_2$/Si/Ge interfaces being of better quality than the Ge/SiO$_2$ interface, as already indicated).

The structure obtained in this way and represented in FIG. 9 is entirely comparable to that obtained and represented in FIG. 4 using the first embodiment and could therefore be used in exactly the same way thereas (in accordance with the steps described hereinabove and represented in FIGS. 5 and 6, and where applicable 7) to form a GeOI structure.

The germanium layer 14 having a thickness less than the critical thickness, as in the first embodiment, the advantages obtained here are identical to those already described.

Furthermore, this solution produces a buried oxide (from the thermal oxide layer 18) of better quality than when this oxide is obtained by deposition (above first embodiment) and a better interface between that oxide and the thin silicon layer (16). It is nevertheless possible, if a thicker oxide layer is required, to deposit a complementary oxide layer on the thermal oxide layer.

Figure 10:
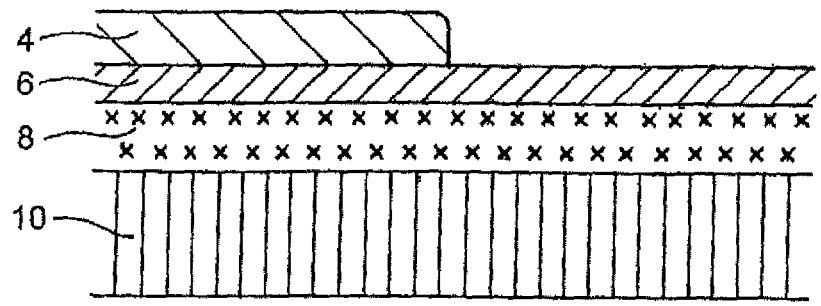
FIGS. 10 and 11 represent two subsequent steps that can be applied to the structures obtained by the aforementioned methods.
Figure 11:
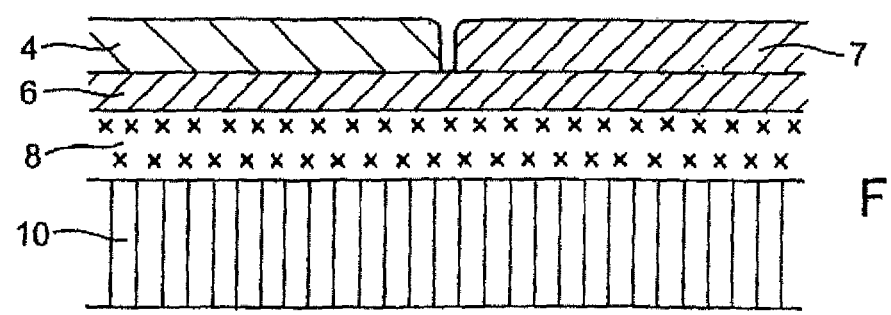

From the structures obtained in FIG. 6 or 7, i.e. GeOI structures having under the thin germanium layer a very thin silicon layer (of good crystalline quality) it is possible to etch the germanium locally, as represented in FIG. 10, to expose locally the thin silicon layer 6, 16, followed by local and selective epitaxial regrowth of silicon on the thin silicon layer 6, 16 to obtain a new silicon layer 7 in the previously etched region of the germanium layer 4, as represented in FIG. 11. For example, after etching the germanium layer and before epitaxial regrowth of silicon, the germanium islets still present could be protected by a local protection layer leaving apertures in the silicon.

This layer could be selectively eliminated after the epitaxial deposition of silicon.

Thanks to the FIG. 11 structure, it is possible to use each of the regions (residual portions of the layer 4 and layer 7 produced by the selective regrowth) and benefit from the properties of each of the two materials, for example to produce different components.

The invention is not limited to the embodiments that have just been described.

For example, although the embodiments described hereinabove propose depositing the germanium layer on relaxed silicon (bulk Si or SOI), it is equally possible to grow the germanium on strained silicon (obtained for example by epitaxial growth on SiGe or coming from a strained silicon on insulator (sSOI) type structure), which has the advantage of increasing the critical thickness of the germanium deposited by epitaxy (in particular, the possible thickness of germanium that can be deposited epitaxially without changing the lattice parameter of the crystalline structure that receives it, thereby minimizing the risk of dislocations).

The germanium can equally be grown on a wafer having at least at the surface a layer of $Si_xGe_{1-x}$, for example SiGeOI, with for example x=0.8, which yields 20% germanium.

This solution also increases the thickness of germanium that can be deposited without degrading crystalline quality.

For these last two examples (strained Si and SiGe), if a silicon layer is deposited epitaxially on the epitaxially deposited germanium layer, care must be taken that the thickness of this silicon layer (formed in this case in a material with a lattice parameter different from that of the superficial layer of the wafer) remains less than the critical thickness that can be deposited epitaxially, given the structure on which that epitaxial deposition is effected, in order to preserve the crystalline quality of this layer and the underlying germanium layer.

The invention claimed is:

1. A method for making a thin-film element comprising the steps of:
    epitaxially growing a first crystalline layer consisting essentially of germanium on a support, the support comprising a surface layer consisting essentially of silicon crystalline material, the first crystalline layer having a thickness of less than 3 nanometers, which comprises a critical thickness above which dislocation defects will appear in the first crystalline layer;
    forming a dielectric layer overlying the first crystalline layer to form a donor structure;
    assembling the donor structure with a receiver wafer; and
    eliminating the support.

2. The method according to claim 1, further comprising, prior to forming the dielectric layer, a step of epitaxially growing a second layer on the first crystalline layer, the second layer comprising silicon, such that a lattice parameter of the second layer is determined by a lattice parameter of the surface layer.

3. The method according to claim 2, wherein the step of forming the dielectric layer comprises a step of at least partially oxidizing the second layer to form the dielectric layer.

4. The method according to claim 1, wherein the step of forming the dielectric layer comprises depositing the dielectric layer.

5. The method according to claim 1, wherein forming a dielectric layer comprises forming an oxide layer.

6. The method according to claim 1, wherein the support comprises a plate of the silicon crystalline material.

7. The method according to claim 1, wherein the support further comprises an insulator underlying the surface layer.

8. The method according to claim 1, wherein the surface layer comprises relaxed silicon.

9. The method according to claim 1, wherein the surface layer comprises strained silicon.

10. The method according to claim 1, wherein a face of the first crystalline layer is exposed upon eliminating the support.

11. The method according to claim 1, wherein eliminating the support comprises applying mechanical forces or chemical processing to remove the support from the donor structure.

12. A method for making a thin-film element comprising:
    providing a support having a strained surface layer characterized by a lattice parameter;
    forming a germanium crystalline layer on the support, the germanium crystalline layer having a thickness of less than 3 nanometers, such that a lattice parameter of the germanium crystalline layer is substantially the same as the lattice parameter of the support, and such that the germanium crystalline layer is substantially free of dislocation defects;
    forming a thin silicon layer on the germanium crystalline layer, the thin silicon layer having an elemental composition different from the germanium crystalline layer, wherein the thin silicon layer has a lattice parameter substantially the same as the lattice parameter of the germanium crystalline layer;
    forming a dielectric layer on the thin silicon layer;
    bonding a receiver wafer to the dielectric layer; and
    removing the support.

13. The method according to claim 12, wherein the strained surface layer of the support comprises silicon or silicon-germanium.

14. The method according to claim 12, wherein the thin silicon layer comprises epitaxially-deposited silicon having a thickness of less than about 1 nm.

15. The method according to claim 14, wherein providing a support comprises providing a silicon substrate having a buried insulator layer, and wherein removing the support comprises mechanical action to remove the silicon and a selective chemical process to remove the buried insulator layer.

16. A method for making a thin-film element comprising the steps of:
    epitaxially growing a first crystalline layer on a second crystalline layer overlying a support, the second crystalline layer comprising a material having a different elemental composition from the first crystalline layer, the first crystalline layer having a thickness less than a critical thickness;
    epitaxially growing a third layer on said first crystalline layer, the third layer comprising a material and thickness selected such that a lattice parameter of the third layer is determined by a lattice parameter of the second crystalline layer;
    forming a dielectric layer on a side of the first crystalline layer opposite the support to form a donor structure;
    assembling the donor structure with a receiver wafer;
    eliminating the support; and
    further comprising the following steps after eliminating the support:
    locally etching of the first crystalline layer as far as the third layer; and
    epitaxially regrowing the first crystalline layer on the regions of the third material layer exposed by the etching.

* * * * *